(12) United States Patent
Miyajima et al.

(10) Patent No.: US 7,449,729 B2
(45) Date of Patent: Nov. 11, 2008

(54) HETEROJUNCTION BIPOLAR TRANSISTOR AND METHOD FOR FABRICATING THE SAME

(75) Inventors: Kenichi Miyajima, Toyama (JP); Keiichi Murayama, Toyama (JP); Hirotaka Miyamoto, Toyama (JP)

(73) Assignee: Panasonic Corporation, Osaka (JP)

( * ) Notice: Subject to any disclaimer, the term of this patent is extended or adjusted under 35 U.S.C. 154(b) by 343 days.

(21) Appl. No.: 11/398,599

(22) Filed: Apr. 6, 2006

(65) Prior Publication Data

US 2006/0237743 A1 Oct. 26, 2006

(30) Foreign Application Priority Data

Apr. 21, 2005 (JP) .............................. 2005-123966

(51) Int. Cl.
  H01L 31/0328 (2006.01)
  H01L 31/0336 (2006.01)
  H01L 31/072 (2006.01)
  H01L 31/109 (2006.01)

(52) U.S. Cl. .............................. 257/197; 257/E29.188
(58) Field of Classification Search ................. 257/197, 257/E31.069, E29.188
See application file for complete search history.

(56) References Cited

U.S. PATENT DOCUMENTS 6,683,332 B2 * 1/2004 Shinozaki et al. ........... 257/186

2005/0199909 A1 * 9/2005 Murayama et al. ........... 257/197

FOREIGN PATENT DOCUMENTS

JP 2001-308103 11/2001

OTHER PUBLICATIONS

Daisuke Ueda et al., "Developing New Epoch in Information Communication—High-frequency optical semiconductor device", The Institute of Electronics, Information and Communication Engineers, Mar. 15, 2001, pp. 51 to 53 (5 pages with Translation).

* cited by examiner

Primary Examiner—Phat X Cao
(74) Attorney, Agent, or Firm—McDermott Will & Emery LLP

(57) ABSTRACT

On a high-concentration n-type first sub-collector layer, a high-concentration n-type second sub-collector layer made of a material having a small bandgap, an i-type or low-concentration n-type collector layer, a high-concentration p-type base layer, an n-type emitter layer made of a material having a large bandgap, a high-concentration n-type emitter cap layer, a high-concentration n-type emitter contact layer made of a material having a small bandgap are sequentially stacked. From the emitter contact layer, an interconnection also serving as an emitter electrode is extended. From the emitter layer or the base layer, an interconnection also serving as a base electrode is extended. From the second sub-collector layer, an interconnection also serving as a collector electrode is extended.

5 Claims, 23 Drawing Sheets

HETEROJUNCTION BIPOLAR TRANSISTOR AND METHOD FOR FABRICATING THE SAME

BACKGROUND OF THE INVENTION

The present invention relates to heterojunction bipolar transistors widely used for high power amplifiers for transmission, and methods for fabricating such heterojunction bipolar transistors.

With recent functional enhancement of cellular phones and increase of capacity in communication with cellular phones, high-frequency analog devices for use in cellular phones have been required to have further enhanced performance. Out of these high-frequency analog devices, heterojunction bipolar transistors (hereinafter, referred to as HBTs) have been already put into practical use as high power amplifiers for transmission. To enhance the performance of the HBTs, the emitter size needs to be reduced.

Hereinafter, a structure of a conventional HBT and a method for fabricating the HBT will be described with reference to FIG. 23 (see, for example, Daisuke Ueda et al., "high-frequency optical semiconductor device", The Institute of Electronics, Information and Communication Engineers, Dec. 1, 1999, pp. 51 to 53).

FIG. 23 is a view schematically illustrating a cross-sectional structure of a conventional HBT. As illustrated in FIG. 23, a sub-collector layer 302 made of a high-concentration n-type GaAs layer is formed on a semi-insulating substrate 301 made of GaAs. A collector layer 303 made of a low-concentration n-type GaAs layer and a base layer 304 made of a high-concentration p-type GaAs layer are formed on a collector region of the sub-collector layer 302. An emitter layer 305 made of an n-type AlGaAs layer, an emitter contact layer 306 made of a high-concentration n-type InGaAs layer, a first emitter electrode 314 made of a WSi layer and a second emitter electrode 311 having a Ti/Pt/Au structure (i.e., a structure in which a Ti layer, a Pt layer and an Au layer are stacked in this order: the same hereinafter) are formed as a stack on an emitter region of the base layer 304. A base electrode 312 having a Ti/Pt/Au structure is formed on a region of the base layer 304 except for the emitter region. A collector electrode 313 having an AuGe/Ni/Au structure (i.e., a structure in which an AuGe layer, a Ni layer and an Au layer are stacked in this order) is formed on a region of the sub-collector layer 302 except for the collector region.

As illustrated in FIG. 23, to electrically isolate HBTs (unit HBTs) from each other, an isolation region 321 is formed in the periphery of each HBT region to reach the semi-insulating substrate 301 through the sub-collector layer 302.

As illustrated in FIG. 23, an insulating film 322 is deposited over the entire surface of the semi-insulating substrate 301 having an HBT structure. Contact holes 323A, 323B and 323C are provided in parts of the insulating film 322 located on the second emitter electrode 311, the base electrode 312 and the collector electrode 313, respectively. An interconnection 315A is extended from the second emitter electrode 311 through the contact hole 323A. An interconnection 315B is extended from the base electrode 312 through the contact hole 323B. An interconnection 315C is extended from the collector electrode 313 through the contact hole 323C.

SUMMARY OF THE INVENTION

However, in the conventional HBT illustrated in FIG. 23, the second emitter electrode 311 and the base electrode 312 have the Ti/Pt/Au structure, whereas the collector electrode 313 has the AuGe/Ni/Au structure. This causes the following problem:

That is, the emitter electrode 311, the base electrode 312 and the collector electrode 313 cannot be formed at a time. In other words, the process of simultaneously forming the emitter electrode 311 and the base electrode 312 and the process of forming the collector electrode 313 need to be performed separately. Specifically, resist formation in which a photoresist having a pattern corresponding to an electrode shape, metal-thin-film formation in which a metal thin film is formed by vapor deposition or sputtering, and lift-off in which the photoresist is removed so as to leave the metal thin film only on a necessary portion need to be performed in each of the processes of forming the electrodes. Accordingly, the conventional HBT has a problem in which the fabrication cost increases as the number of fabrication process steps increases.

In addition, since the contact hole 323A is provided in a portion of the insulating film 322 located on the second emitter electrode 311 and the interconnection 315A is extended from the second emitter electrode 311 through this contact hole 323A, the conventional HBT has the following problem:

That is, in forming the emitter of the conventional HBT, the emitter contact layer 306 is formed by dry etching or wet etching using the first emitter electrode 314 as a mask. Accordingly, the size of the emitter region, i.e., the emitter size, needs to be increased in consideration of a misalignment between the emitter contact layer 306 and the second emitter electrode 311, a misalignment between the second emitter electrode 311 and the contact hole 323A and a misalignment between the contact hole 323A and the interconnection 315A.

It is therefore an object of the present invention to provide an HBT and a method capable of reducing the emitter size and reducing the fabrication cost.

To achieve the object, a first HBT according to the present invention includes: a high-concentration n-type first sub-collector layer; a high-concentration n-type second sub-collector layer formed on the first sub-collector layer and made of a material having a bandgap smaller than that of the first sub-collector layer; an i-type or low-concentration n-type collector layer formed on a given portion of the second sub-collector layer; a high-concentration p-type base layer formed on the collector layer; an n-type emitter layer formed on the base layer and made of a material having a bandgap larger than that of the base layer; a high-concentration n-type emitter cap layer formed on a given portion of the emitter layer; a high-concentration n-type emitter contact layer formed on the emitter cap layer and made of a material having a bandgap smaller than that of the emitter cap layer; a first interconnection extended from the emitter contact layer and including a portion serving as an emitter electrode; a second interconnection extended from a portion of the emitter layer on which the emitter cap layer is not formed and including a portion serving as a base electrode; and a third interconnection extended from a portion of the second sub-collector layer on which the collector layer is not formed and including a portion serving as a collector electrode.

A second HBT according to the present invention includes: a high-concentration n-type first sub-collector layer; a high-concentration n-type second sub-collector layer formed on the first sub-collector layer and made of a material having a bandgap smaller than that of the first sub-collector layer; an i-type or low-concentration n-type collector layer formed on a given portion of the second sub-collector layer; a high-concentration p-type base layer formed on the collector layer; an n-type emitter layer formed on a given portion of the base layer and made of a material having a bandgap larger than that of the base layer; a high-concentration n-type emitter cap layer formed on the emitter layer; a high-concentration n-type emitter contact layer formed on the emitter cap layer and made of a material having a bandgap smaller than that of the emitter cap layer; a first interconnection extended from the emitter contact layer and including a portion serving as an emitter electrode; a second interconnection extended from a portion of the base layer on which the emitter layer is not formed and including a portion serving as a base electrode; and a third interconnection extended from a portion of the second sub-collector layer on which the collector layer is not formed and including a portion serving as a collector electrode.

A third HBT according to the present invention includes: a high-concentration n-type first sub-collector layer; a high-concentration n-type second sub-collector layer formed on the first sub-collector layer and made of a material having a bandgap smaller than that of the first sub-collector layer; an i-type or low-concentration n-type collector layer formed on a given portion of the second sub-collector layer; a high-concentration p-type base layer formed on the collector layer; an n-type emitter layer formed on the base layer, having an edge projecting from the base layer to form an eave, and made of a material having a bandgap larger than that of the base layer; a high-concentration n-type emitter cap layer formed on a given portion of the emitter layer; and a high-concentration n-type emitter contact layer formed on the emitter cap layer, having an edge projecting from the emitter cap layer to form an eave, and made of a material having a bandgap smaller than that of the emitter cap layer, wherein a first interconnection extended from the emitter contact layer and including a portion serving as an emitter electrode, a second interconnection extended from a portion of the emitter layer on which the emitter cap layer is not formed and including a portion serving as a base electrode, and a third interconnection extended from a portion of the second sub-collector layer on which the collector layer is not formed and including a portion serving as a collector electrode are formed in a self-aligned manner.

A fourth HBT according to the present invention includes: a high-concentration n-type first sub-collector layer; a high-concentration n-type second sub-collector layer formed on the first sub-collector layer and made of a material having a bandgap smaller than that of the first sub-collector layer; an i-type or low-concentration n-type collector layer formed on a given portion of the second sub-collector layer; a high-concentration p-type base layer formed on the collector layer, having an edge projecting from the collector layer to form an eave, and made of a material different from that of the collector layer; an n-type emitter layer formed on a given portion of the base layer and made of a material having a bandgap larger than that of the base layer; a high-concentration n-type emitter cap layer formed on the emitter layer; and a high-concentration n-type emitter contact layer formed on the emitter cap layer, having an edge projecting from the emitter cap layer to form an eave, and made of a material having a bandgap smaller than that of the emitter cap layer, wherein a first interconnection extended from the emitter contact layer and including a portion serving as an emitter electrode, a second interconnection extended from a portion of the base layer on which the emitter layer is not formed and including a portion serving as a base electrode, and a third interconnection extended from a portion of the second sub-collector layer on which the collector layer is not formed and including a portion serving as a collector electrode are formed in a self-aligned manner.

A first method for fabricating an HBT according to the present invention includes the steps of: sequentially forming, over a principal surface of a semi-insulating substrate, a high-concentration n-type first sub-collector layer, a high-concentration n-type second sub-collector layer made of a material having a bandgap smaller than that of the first sub-collector layer, an i-type or low-concentration n-type collector-layer film, a high-concentration p-type base-layer film, an n-type emitter-layer film made of a material having a bandgap larger than that of the base-layer film, a high-concentration n-type emitter-cap-layer film, and a high-concentration n-type emitter-contact-layer film made of a material having a bandgap smaller than that of the emitter-cap-layer film; patterning the emitter-contact-layer film and the emitter-cap-layer film to form an emitter contact layer and an emitter cap layer such that a base-electrode region of the emitter-layer film is exposed; patterning the emitter-layer film, the base-layer film and the collector-layer film to form an emitter layer, a base layer and a collector layer such that a collector-electrode region of the second sub-collector layer is exposed; forming a first interconnection extended from the emitter contact layer and including a portion serving as an emitter electrode; forming a second interconnection extended from the base-electrode region of the emitter layer and including a portion serving as a base electrode; and forming a third interconnection extended from the collector-electrode region of the second sub-collector layer and including a portion serving as a collector electrode.

A second method for fabricating an HBT according to the present invention includes the steps of: sequentially forming, over a principal surface of a semi-insulating substrate, a high-concentration n-type first sub-collector layer, a high-concentration n-type second sub-collector layer made of a material having a bandgap smaller than that of the first sub-collector layer, an i-type or low-concentration n-type collector-layer film, a high-concentration p-type base-layer film, an n-type emitter-layer film made of a material having a bandgap larger than that of the base-layer film, a high-concentration n-type emitter-cap-layer film, and a high-concentration n-type emitter-contact-layer film made of a material having a bandgap smaller than that of the emitter-cap-layer film; patterning the emitter-contact-layer film, the emitter-cap-layer film and the emitter-layer film to form an emitter contact layer, an emitter cap layer and an emitter layer such that a base-electrode region of the base-layer film is exposed; patterning the base-layer film and the collector-layer film to form a base layer and a collector layer such that a collector-electrode region of the second sub-collector layer is exposed; forming a first interconnection extended from the emitter contact layer and including a portion serving as an emitter electrode; forming a second interconnection extended from the base-electrode region of the base layer and including a portion serving as a base electrode; and forming a third interconnection extended from the collector-electrode region of the second sub-collector layer and including a portion serving as a collector electrode.

A third method for fabricating an HBT according to the present invention includes the steps of: sequentially forming, over a principal surface of a semi-insulating substrate, a high-concentration n-type first sub-collector layer, a high-concentration n-type second sub-collector layer made of a material having a bandgap smaller than that of the first sub-collector layer, an i-type or low-concentration n-type collector-layer film, a high-concentration p-type base-layer film, an n-type emitter-layer film made of a material having a bandgap larger than that of the base-layer film, a high-concentration n-type emitter-cap-layer film, and a high-concentration n-type emitter-contact-layer film made of a material having a bandgap smaller than that of the emitter-cap-layer film; patterning the emitter-contact-layer film and the emitter-cap-layer film to form an emitter contact layer and an emitter cap layer such that a base-electrode region of the emitter-layer film is exposed; patterning the emitter-layer film, the base-layer film and the collector-layer film to form an emitter layer, a base layer and a collector layer such that a collector-electrode region of the second sub-collector layer is exposed; performing side etching on the base layer and the collector layer such that an edge of the emitter layer projects from the base layer to form an eave; performing side etching on the emitter cap layer such that an edge of the emitter contact layer projects from the emitter cap layer to form an eave; and forming a first interconnection, a second interconnection and a third interconnection in a self-aligned manner, the first interconnection being extended from the emitter contact layer and including a portion serving as an emitter electrode, the second interconnection being extended from the base-electrode region of the emitter layer and including a portion serving as a base electrode, the third interconnection being extended from the collector-electrode region of the second sub-collector layer and including a portion serving as a collector electrode.

A fourth method for fabricating an HBT according to the present invention includes the steps of: sequentially forming, over a principal surface of a semi-insulating substrate, a high-concentration n-type first sub-collector layer, a high-concentration n-type second sub-collector layer made of a material having a bandgap smaller than that of the first sub-collector layer, an i-type or low-concentration n-type collector-layer film, a high-concentration p-type base-layer film made of a material different from that of the collector-layer film, an n-type emitter-layer film made of a material having a bandgap larger than that of the base-layer film, a high-concentration n-type emitter-cap-layer film, and a high-concentration n-type emitter-contact-layer film made of a material having a bandgap smaller than that of the emitter-cap-layer film; patterning the emitter-contact-layer film, the emitter-cap-layer film and the emitter-layer film to form an emitter contact layer, an emitter cap layer and an emitter layer such that a base-electrode region of the base-layer film is exposed; patterning the base-layer film and the collector-layer film to form a base layer and a collector layer such that a collector-electrode region of the second sub-collector layer is exposed; performing side etching on the collector layer such that an edge of the base layer projects from the collector layer to form an eave; performing side etching on the emitter cap layer and the emitter layer such that an edge of the emitter contact layer projects from the emitter cap layer to form an eave; and forming a first interconnection, a second interconnection and a third interconnection in a self-aligned manner, the first interconnection being extended from the emitter contact layer and including a portion serving as an emitter electrode, the second interconnection being extended from the base-electrode region of the base layer and including a portion serving as a base electrode, the third interconnection being extended from the collector-electrode region of the second sub-collector layer and including a portion serving as a collector electrode.

The "high concentration" herein means that the impurity concentration of $1\times10^{18}$ cm$^{-3}$ or more and the "low concentration" herein means that the impurity concentration of $1\times10^{17}$ cm$^{-3}$ or less.

According to the present invention, a high-concentration n-type semiconductor made of a material having a small bandgap is used for each of the emitter contact layer and the second sub-collector layer. Accordingly, an Ohmic contact is easily formed between a metal used for the first interconnection (emitter extended interconnection) extended from the emitter contact layer and the emitter contact layer. In addition, an Ohmic contact is also easily formed between a metal used for the third interconnection (collector extended interconnection) extended from the second sub-collector layer and the second sub-collector layer. That is, not only the second interconnection (base extended interconnection) also serving as the base electrode but also the emitter extended interconnection also serving as the emitter electrode and the collector extended interconnection also serving as the collector electrode are formed. As a result, process steps for forming an emitter electrode, a base electrode and a collector electrode, which are performed separately from process steps for forming interconnections in conventional techniques, are omitted, thus reducing fabrication cost.

In conventional techniques, in determining the emitter size, it is necessary to consider three misalignments: a misalignment between an emitter contact layer and an emitter electrode; a misalignment between an emitter electrode and a contact hole; and a misalignment between a contact hole and an interconnection.

On the other hand, in the first and second HBTs and the first and second methods for fabricating HBTs, in determining the emitter size, it is sufficient to consider only two misalignments: a misalignment between the emitter contact layer and the contact hole; and a misalignment between the contact hole and the interconnection. Accordingly, the emitter size is reduced as compared to conventional techniques. This allows higher performance of HBTs, i.e., enhancement of high-frequency characteristics.

In addition, in the third and fourth HBTs and the third and fourth methods for fabricating HBTs, the interconnections such as the emitter extended interconnection are formed in a self-aligned manner, i.e., the emitter extended interconnection is formed without formation of a contact hole. Accordingly, in determining the emitter size, it is unnecessary to consider a misalignment between the emitter contact layer and a contact hole and a misalignment between a contact hole and the emitter extended interconnection. Accordingly, the emitter size is further reduced as compared to conventional techniques. This allows much higher performance of HBTs, i.e., further enhancement of high-frequency characteristics.

Moreover, in the third and fourth HBTs and the third and fourth methods for fabricating HBTs, the base extended interconnection is formed without formation of a contact hole. Accordingly, the distance between a base-electrode portion of the base extended interconnection and the emitter (i.e., an effective emitter region) is reduced. Accordingly, the base resistance is reduced, resulting in further enhancement of high-frequency characteristics.

As described above, in the HBTs and the methods for fabricating HBTs according to the present invention, reduction of the emitter size is enabled, thus enhancing high-frequency characteristics of HBTs and reducing fabrication cost of HBTs.

That is, the present invention relates to HBTs and methods for fabricating HBTs and is very useful for enhancement of high-frequency characteristics and reduction of fabrication cost of HBTs.

DETAILED DESCRIPTION OF THE INVENTION

Embodiment 1

Hereinafter, an HBT and a method for fabricating the HBT according to a first embodiment of the present invention will be described with reference to the drawings.

Figure 1:
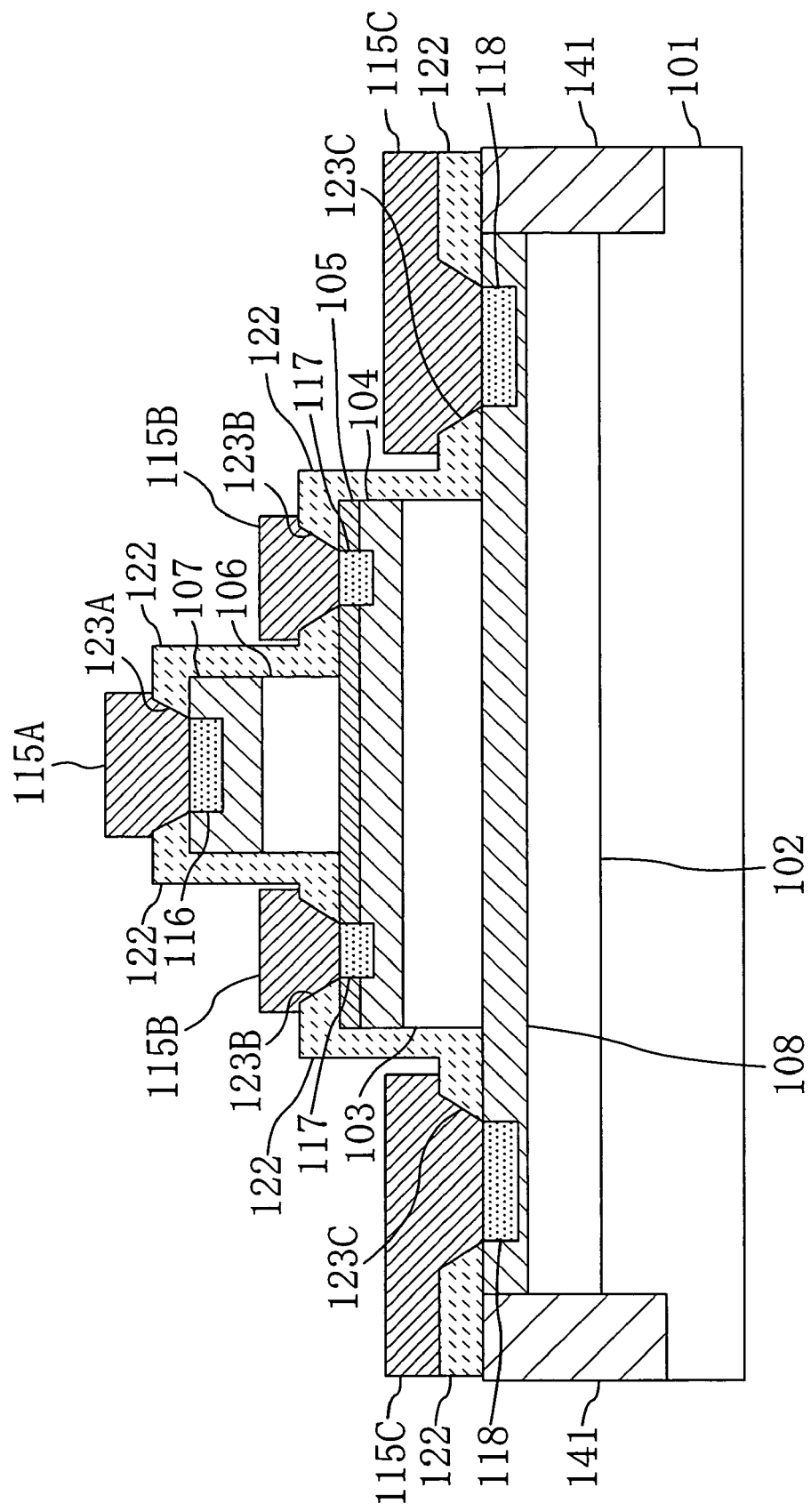
FIG. 1 is a cross-sectional view illustrating a structure of an HBT according to a first embodiment of the present invention.

FIG. 1 is a cross-sectional view illustrating a structure of the HBT of this embodiment.

As illustrated in FIG. 1, a first sub-collector layer 102 made of an n-type GaAs layer doped with an n-type impurity at a high concentration of, for example, about $5 \times 10^{18}$ cm$^{-3}$ is formed on a semi-insulating substrate 101 made of, for example, GaAs. A second sub-collector layer 108 made of an n-type InGaAs layer doped with an n-type impurity at a high concentration of, for example, about $1 \times 10^{19}$ cm$^{-3}$ is formed on the first sub-collector layer 102. The bandgap of InGaAs forming the second sub-collector layer 108 is smaller than that of GaAs forming the first sub-collector layer 102.

On a given region of the second sub-collector layer 108, a collector layer 103 made of an n-type GaAs layer doped with an n-type impurity at a low concentration of, for example, about $1 \times 10^{16}$ cm$^{-3}$, a base layer 104 made of a p-type GaAs layer doped with a p-type impurity at a high concentration of, for example, about $4 \times 10^{19}$ cm$^{-3}$, and an emitter layer 105 made of an n-type InGaP (specifically, $In_{0.48}Ga_{0.52}P$ having an In content of about 48%) layer doped with an n-type impurity at a concentration of, for example, about $3 \times 10^{17}$ cm$^{-3}$, are stacked in this order. That is, the stack of the collector layer 103, the base layer 104 and the emitter layer 105 is formed into an island shape on the second sub-collector layer 108. As the collector layer 103, an i-type GaAs layer may be used. The bandgap of $In_{0.48}Ga_{0.52}P$ forming the emitter layer 105 is larger than that of GaAs forming the base layer 104.

On a given region of the emitter layer 105, an emitter cap layer 106 made of an n-type GaAs layer doped with an n-type impurity at a high concentration of, for example, about $3 \times 10^{18}$ cm$^{-3}$ and an emitter contact layer 107 made of an n-type InGaAs layer doped with an n-type impurity at a high concentration of, for example, about $1 \times 10^{19}$ cm$^{-3}$ are stacked in this order. That is, the stack of the emitter cap layer 106 and the emitter contact layer 107 is formed into an island shape on the emitter layer 105. The bandgap of InGaAs forming the emitter contact layer 107 is smaller than that of GaAs forming the emitter cap layer 106.

An insulating film 122 is deposited to cover the entire surface of the semi-insulating substrate 101 provided with the semiconductor layers described above. Contact holes 123A, 123B and 123C are provided in portions of the insulating film 122 located on the emitter contact layer 107, the emitter layer 105 (i.e., a portion on which the emitter cap layer 106 is not formed) and the second sub-collector layer 108 (i.e., a portion on which the collector layer 103 is not formed), respectively.

This embodiment is characterized in that an interconnection 115A is directly extended from the emitter contact layer 107 through the contact hole 123A, an interconnection 115B is directly extended from the emitter layer 105 through the contact hole 123B, and an interconnection 115C is directly extended from the second sub-collector layer 108 through the contact hole 123C. That is, the interconnection 115A has a portion serving as an emitter electrode, the interconnection 115B has a portion serving as a base electrode, and the interconnection 115C has a portion serving as a collector electrode. Each of the interconnections 115A, 115B and 115C has a Pt/Ti/Pt/Au/Ti structure (in which a Pt layer, a Ti layer, a Pt layer, an Au layer and a Ti layer are stacked in this order: the same hereinafter), for example.

In a portion of the emitter contact layer 107 connected to the interconnection 115A (i.e., the portion serving as the emitter electrode), a first Pt alloyed reaction layer 116 is formed. The first Pt alloyed reaction layer 116 is formed by a reaction between Pt forming the bottom layer of the interconnection 115A and InGaAs forming the emitter contact layer 107 under heat treatment. The first Pt alloyed reaction layer 116 is formed only inside the emitter contact layer 107.

In portions of the emitter layer 105 connected to the interconnections 115B (i.e., the portion serving as the base electrode), a second Pt alloyed reaction layer 117 is formed. The second Pt alloyed reaction layer 117 is formed by a reaction between Pt forming the bottom layer of the interconnection 115B and InGaP forming the emitter layer 105 under heat treatment. The second Pt alloyed reaction layer 117 penetrates through the emitter layer 105 to reach the base layer 104. Accordingly, the interconnection 115B (i.e., the portion serving as the base electrode) and the base layer 104 are in contact with each other through the second Pt alloyed reaction layer 117, thus ensuring formation of an Ohmic contact.

In portions of the second sub-collector layer 108 connected to the interconnection 115C (i.e., the portion serving as collector electrode), a third Pt alloyed reaction layer 118 is formed. The third Pt alloyed reaction layer 118 is formed by a reaction between Pt forming the bottom layer of the interconnection 115C and InGaAs forming the second sub-collector layer 108 under heat treatment. The third Pt alloyed reaction layer 118 is formed only inside the second sub-collector layer 108.

In this embodiment, to electrically isolate HBTs (unit HBTs) from each other, an isolation region 141 is formed in the periphery of each HBT region to reach the substrate 101 through the stack of the second sub-collector layer 108 and the first sub-collector layer 102.

Hereinafter, a method for fabricating an HBT illustrated in FIG. 1 according to this embodiment will be described with reference to the drawings.

FIGS. 2A through 2C, FIGS. 3A and 3B and FIG. 4 are cross-sectional views showing respective process steps of the method for fabricating an HBT of this embodiment.

Figure 2A:
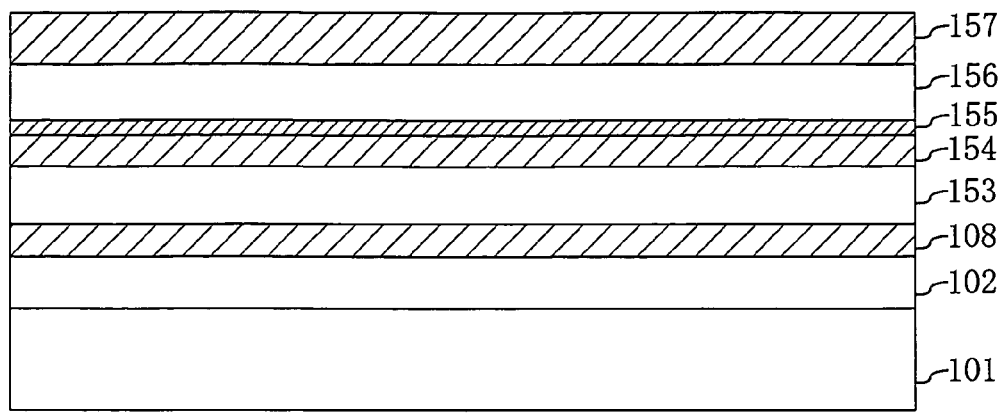
FIGS. 2A through 2C are cross-sectional views showing respective process steps of a method for fabricating the HBT according to the first embodiment.

First, as shown in FIG. 2A, a first sub-collector layer 102 made of an n-type GaAs layer doped with an n-type impurity at a high concentration of, for example, about $5 \times 10^{18}$ cm$^{-3}$, a second sub-collector layer 108 made of an n-type InGaAs layer doped with an n-type impurity at a high concentration of, for example, about $1 \times 10^{19}$ cm$^{-3}$, a collector-layer film 153 made of an n-type GaAs layer doped with an n-type impurity at a low concentration of, for example, about $1 \times 10^{16}$ cm$^{-3}$, a base-layer film 154 made of a p-type GaAs layer doped with a p-type impurity at a high concentration of, for example, about $4 \times 10^{19}$ cm$^{-3}$, an emitter-layer film 155 made of an n-type InGaP (specifically, $In_{0.48}Ga_{0.52}P$ having an In content of about 48%) layer doped with an n-type impurity at a concentration of, for example, about $3 \times 10^{17}$ cm$^{-3}$, an emitter-cap-layer film 156 made of an n-type GaAs layer doped with an n-type impurity at a high concentration of, for example, about $3 \times 10^{18}$ cm$^{-3}$, and an emitter-contact-layer film 157 made of an n-type InGaAs layer doped with an n-type impurity at a high concentration of, for example, about $1 \times 10^{19}$ cm$^{-3}$ are formed in this order by crystal growth processes such as molecular beam epitaxy (MBE) or metal organic chemical vapor deposition (MOCVD) over a semi-insulating substrate 101 made of, for example, GaAs. As the collector-layer film 153, an i-type GaAs layer may be formed. The bandgap of $In_{0.48}Ga_{0.52}P$ forming the emitter-layer film 155 is larger than that of GaAs forming the base-layer film 154. The bandgap of InGaAs forming the emitter-contact-layer film 157 is smaller than that of GaAs forming the emitter-cap-layer film 156.

Figure 2B:
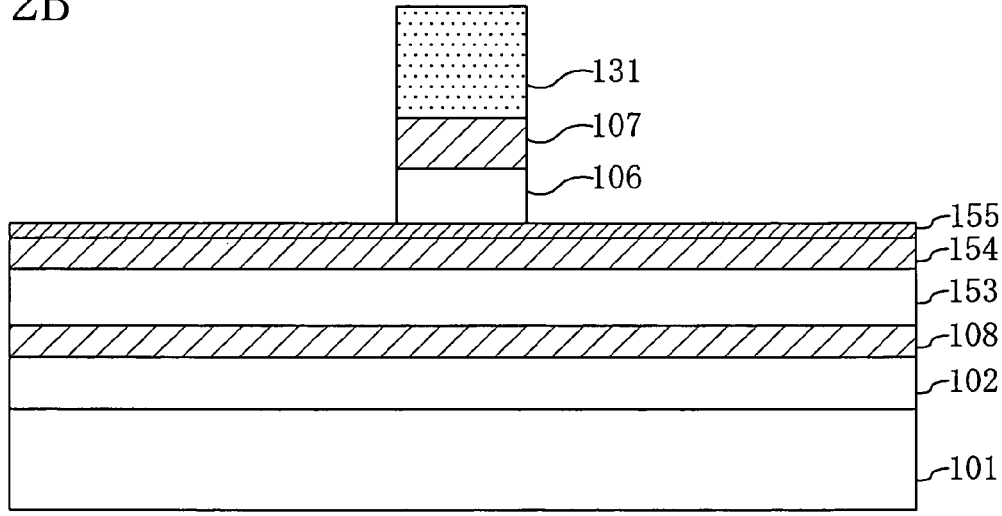

Next, as shown in FIG. 2B, the emitter-contact-layer film 157 and the emitter-cap-layer film 156 are sequentially patterned by dry etching or wet etching using a photoresist pattern 131 protecting an emitter region as a mask. In this manner, an emitter island region made of the stack of an emitter cap layer 106 and an emitter contact layer 107 is formed and a base-electrode region of the emitter-layer film 155 is exposed. At this time, the emitter-layer film 155 made of $In_{0.48}Ga_{0.52}P$ is hardly etched.

Figure 2C:
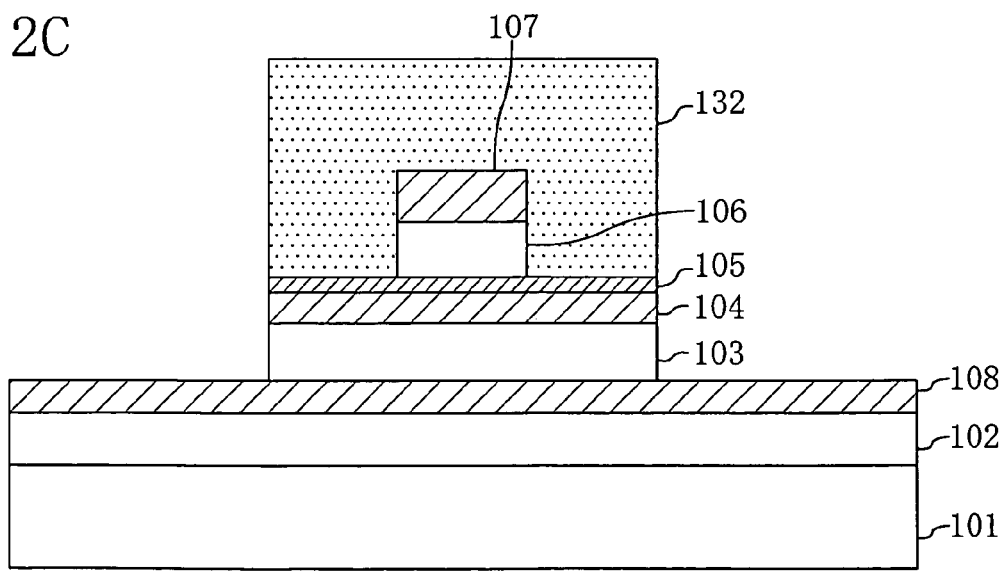

Then, the photoresist pattern 131 is removed. Thereafter, as shown in FIG. 2C, the emitter-layer film 155, the base-layer film 154 and the collector-layer film 153 are sequentially patterned by dry etching or wet etching using a photoresist pattern 132 protecting a base region including the emitter region as a mask. In this manner, a base island region made of the stack of a collector layer 103, a base layer 104 and an emitter layer 105 is formed and a collector-electrode region of the second sub-collector layer 108 is exposed. At this time, the second sub-collector layer 108 made of InGaAs is hardly etched. That is, the second sub-collector layer 108, which is an InGaAs layer, serves as an etching stopper, so that the etching accuracy in forming the base island region is greatly enhanced, as compared to conventional techniques.

Figure 3A:
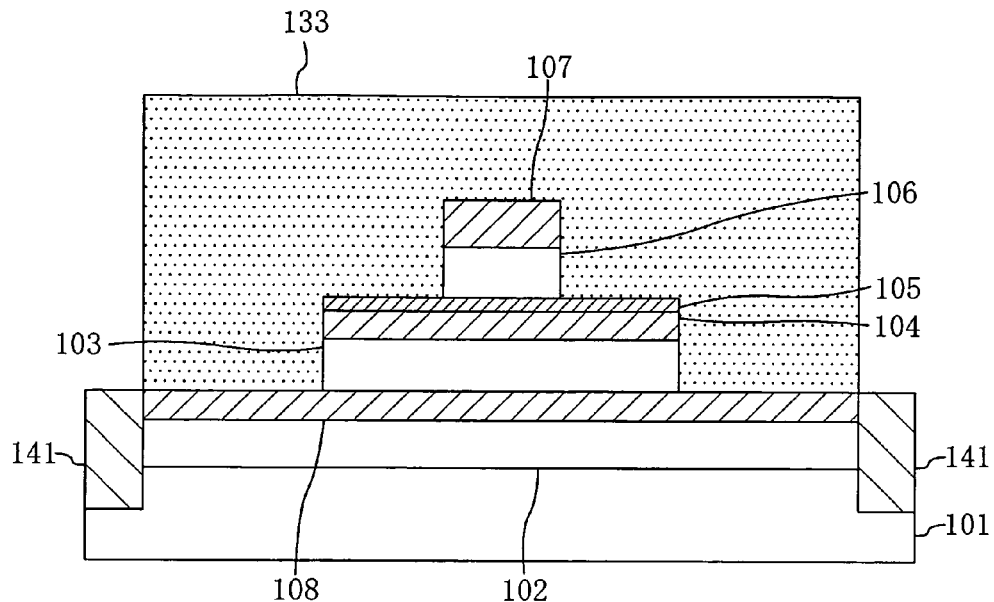
FIGS. 3A and 3B are cross-sectional views showing respective process steps of the method for fabricating the HBT of the first embodiment.

Thereafter, the photoresist pattern 132 is removed. Then, as shown in FIG. 3A, helium (He) ions, for example, are implanted in the second sub-collector layer 108 and the first sub-collector layer 102 using a photoresist pattern 133 protecting unit HBT cells (i.e., HBT regions) as a mask, thereby forming an isolation region 141. In this manner, the unit HBT cells are isolated from each other.

Figure 3B:
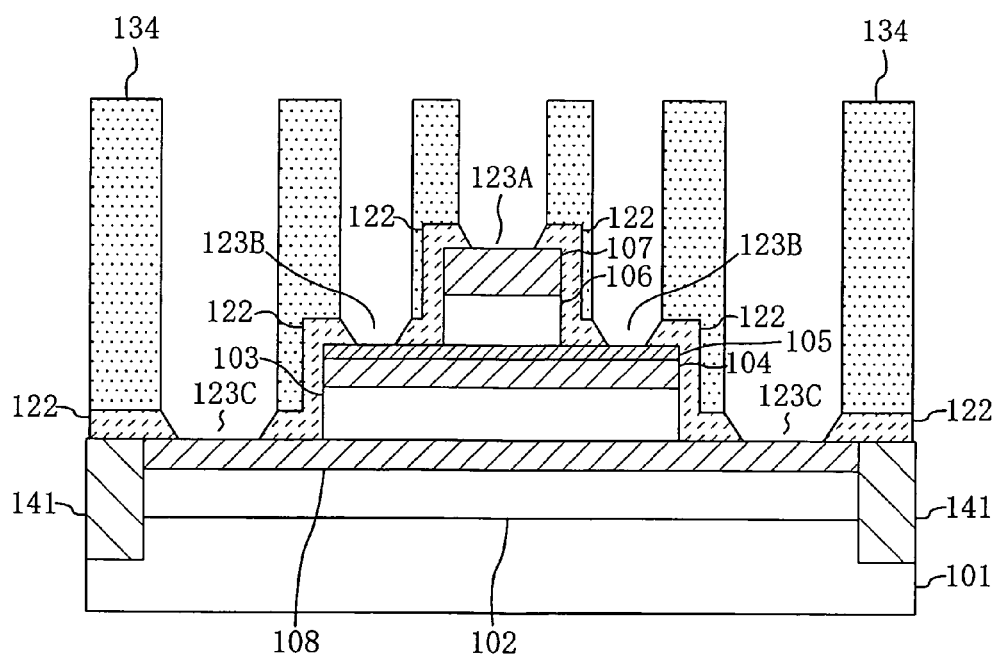

Subsequently, the photoresist pattern 133 is removed. Then, as shown in FIG. 3B, an insulating film 122 made of, for example, a $SiO_2$ film is deposited to cover the entire surface of the semi-insulating substrate 101. Thereafter, a photoresist pattern 134 having openings on the emitter contact layer 107, the emitter layer 105 (i.e., a portion on which the emitter cap layer 106 is not formed) and the second sub-collector layer 108 (i.e., a portion on which the collector layer 103 is not formed) is formed. Subsequently, dry etching or wet etching is performed on the insulating film 122 using the photoresist pattern 134 as a mask, thereby forming contact holes 123A, 123B and 123C reaching the emitter contact layer 107, the emitter layer 105 (i.e., the portion on which the emitter cap layer 106 is not formed) and the second sub-collector layer 108 (i.e., the portion on which the collector layer 103 is not formed), respectively.

Figure 4:
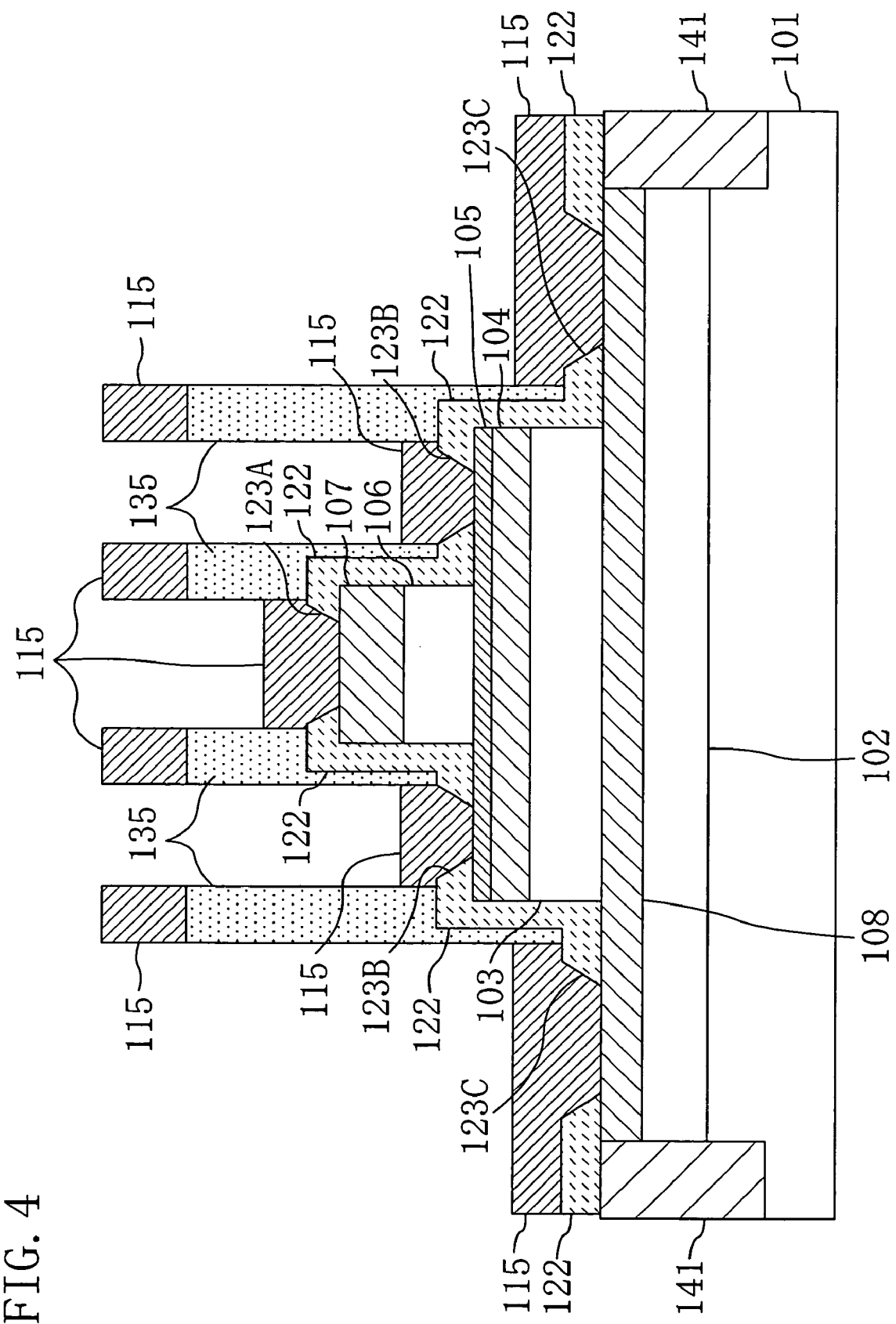
FIG. 4 is a cross-sectional view showing a process step of the method for fabricating the HBT of the first embodiment.

Then, the photoresist pattern 134 is removed. Thereafter, as shown in FIG. 4, a photoresist pattern 135 having openings in interconnection regions including the contact holes 123A, 123B and 123C is formed. Subsequently, an interconnection conductive film 115 is formed by, for example, vapor deposition to cover the entire surface of the semi-insulating substrate 101. At this time, the interconnection conductive film 115 has a structure in which a Pt layer, a Ti layer, a Pt layer, an Au layer and a Ti layer are stacked in this order, for example. Subsequently, the photoresist pattern 135 and its overlying interconnection conductive film 115 are removed by lift-off, thereby forming an interconnection 115A extended from the emitter contact layer 107 through the contact hole 123A, an interconnection 115B extended from the emitter layer 105 through the contact hole 123B and an interconnection 115C extended from the second sub-collector layer 108 through the contact hole 123C. That is, in this embodiment, the interconnections 115A, 115B and 115C also serve as an emitter electrode, a base electrode and a collector electrode, respectively.

Thereafter, heat treatment for inactivating the isolation region (i.e., an isolation region formed by ion implantation) 141 for electrically isolating unit HBT cells from each other is performed. In this embodiment, with this heat treatment, a metal (specifically, Pt) forming the bottom layer of the interconnection 115A and a material forming a portion of the emitter contact layer 107 in contact with the interconnection 115A react with each other. In the same manner, a metal (specifically, Pt) forming the bottom layer of the interconnection 115B and a material forming a portion of the emitter layer 105 in contact with the interconnection 115B react with each other. In addition, a metal (specifically, Pt) forming the bottom layer of the interconnection 115C and a material forming a portion of the second sub-collector layer 108 in contact with the interconnection 115C react with each other. In this manner, as shown in FIG. 1, a first Pt alloyed reaction layer 116 is formed in a portion of the emitter contact layer 107 located under the interconnection 115A, a second Pt alloyed reaction layer 117 is formed in a portion of the emitter layer 105 located under the interconnection 115B, and a third Pt alloyed reaction layer 118 is formed in a portion of the second sub-collector layer 108 located under the interconnection 115C. The first Pt alloyed reaction layer 116 is formed only inside the emitter contact layer 107. The second Pt alloyed reaction layer 117 penetrates through the emitter layer 105 to make an Ohmic contact with the base layer 104. The third Pt alloyed reaction layer 118 is formed only inside the second sub-collector layer 108.

In the method described above, an HBT illustrated in FIG. 1 of this embodiment is completed.

In the first embodiment, a high-concentration n-type semiconductor of a material having a small bandgap is used for each of the emitter contact layer 107 and the second sub-collector layer 108. Accordingly, an Ohmic contact is easily formed between a metal used for the interconnection (emitter extended interconnection) 115A extended from the emitter contact layer 107 and the emitter contact layer 107. In addition, an Ohmic contact is also easily formed between a metal used for the interconnection (collector extended interconnection) 115C extended from the second sub-collector layer 108 and the second sub-collector layer 108. That is, not only the interconnection (base extended interconnection) 115B also serving as the base electrode but also the emitter extended interconnection 115A also serving as the emitter electrode and the collector extended interconnection 115C also serving as the collector electrode are formed. As a result, process steps for forming an emitter electrode, a base electrode and a collector electrode, which are performed separately from process steps for forming interconnections in conventional techniques, are omitted, thus reducing fabrication cost.

In conventional techniques, it is necessary to consider three misalignments: a misalignment between an emitter contact layer and an emitter electrode; a misalignment between an emitter electrode and a contact hole; and a misalignment between a contact hole and an interconnection.

On the other hand, in the first embodiment, in determining the emitter size, it is sufficient to consider only two misalignments: a misalignment between the emitter contact layer 107 and the contact hole 123A; and a misalignment between the contact hole 123A and the emitter extended interconnection 115A. Accordingly, the emitter size is further reduced as compared to conventional techniques. This allows higher performance of HBTs, i.e., enhancement of high-frequency characteristics.

Embodiment 2

Hereinafter, an HBT and a method for fabricating the HBT according to a second embodiment of the present invention will be described with reference to the drawings. The HBT of this embodiment is different from that of the first embodiment in that a portion of the interconnection 115B serving as a base electrode is formed over the base layer 104 with the emitter layer 105 sandwiched therebetween in the first embodiment, whereas the portion of the interconnection 115B serving as the base electrode is formed directly on the base layer 104 in this embodiment, as described later.

Figure 5:
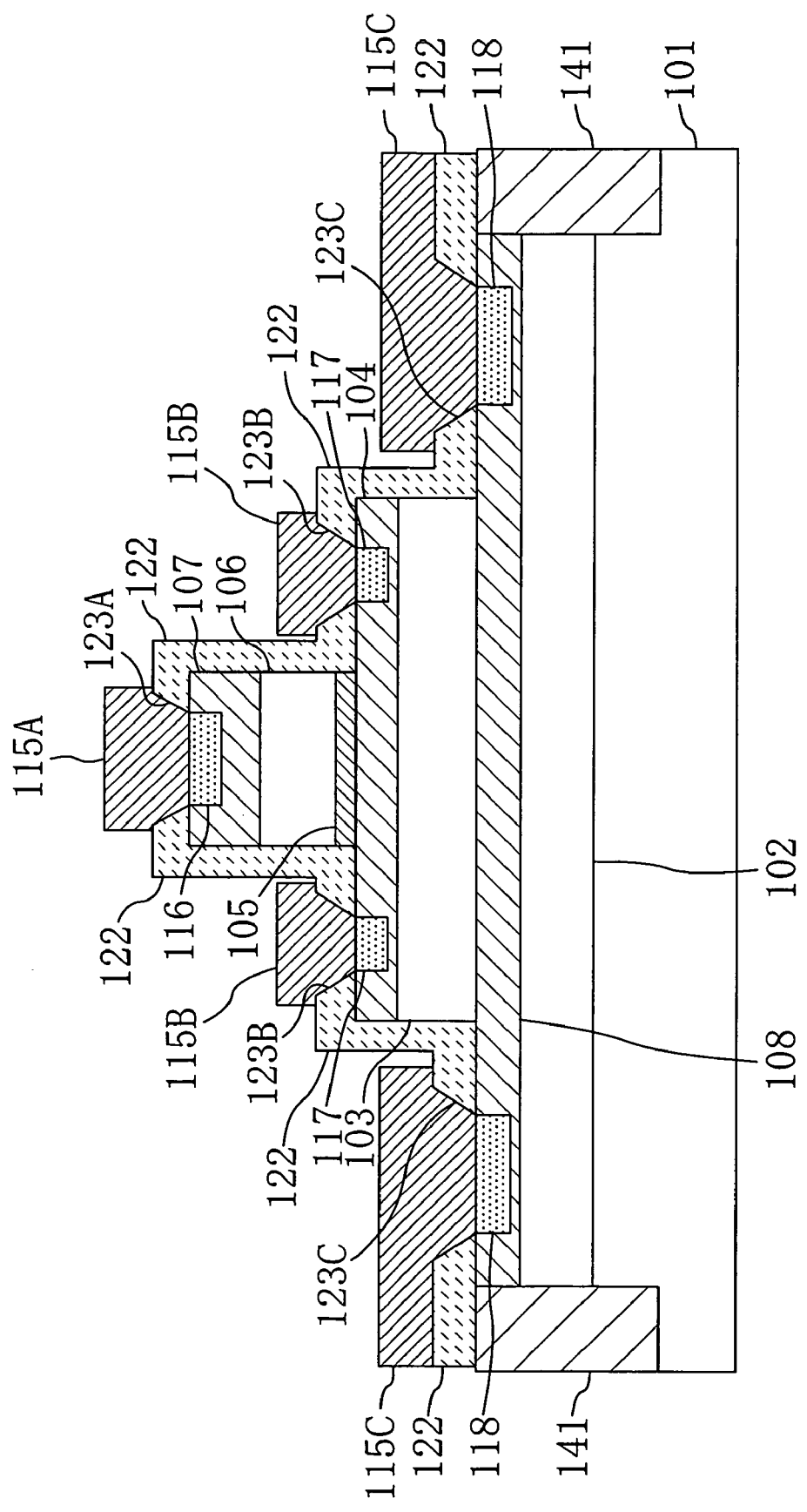
FIG. 5 is a cross-sectional view illustrating a structure of an HBT according to a second embodiment of the present invention.

FIG. 5 is a cross-sectional view illustrating a structure of the HBT of this embodiment.

As illustrated in FIG. 5, a first sub-collector layer 102 made of an n-type GaAs layer doped with an n-type impurity at a high concentration of, for example, about $5\times10^{18}$ cm$^{-3}$ is formed on a semi-insulating substrate 101 made of, for example, GaAs. A second sub-collector layer 108 made of an n-type InGaAs layer doped with an n-type impurity at a high concentration of, for example, about $1\times10^{19}$ cm$^{-3}$ is formed on the first sub-collector layer 102. The bandgap of InGaAs forming the second sub-collector layer 108 is smaller than that of GaAs forming the first sub-collector layer 102.

On a given region of the second sub-collector layer 108, a collector layer 103 made of an n-type GaAs layer doped with an n-type impurity at a low concentration of, for example, about $1\times10^{16}$ cm$^{-3}$ and a base layer 104 made of a p-type GaAs layer doped with a p-type impurity at a high concentration of, for example, about $4\times10^{19}$ cm$^{-3}$ are stacked in this order. That is, the stack of the collector layer 103 and the base layer 104 is formed into an island shape on the second sub-collector layer 108. As the collector layer 103, an i-type GaAs layer may be used.

On a given region of the base layer 104, an emitter layer 105 made of an n-type InGaP (specifically, In$_{0.48}$Ga$_{0.52}$P having an In content of about 48%) layer doped with an n-type impurity at a concentration of, for example, about $3\times10^{17}$ cm$^{-3}$, an emitter cap layer 106 made of an n-type GaAs layer doped with an n-type impurity at a high concentration of, for example, about $3\times10^{18}$ cm$^{-3}$ and an emitter contact layer 107 made of an n-type InGaAs layer doped with an n-type impurity at a high concentration of, for example, about $1\times10^{19}$ cm$^{-3}$ are stacked in this order. That is, the stack of the emitter layer 105, the emitter cap layer 106 and the emitter contact layer 107 is formed into an island shape on the base layer 104. The bandgap of In$_{0.48}$Ga$_{0.52}$P forming the emitter layer 105 is larger than that of GaAs forming the base layer 104. The bandgap of InGaAs forming the emitter contact layer 107 is smaller than that of GaAs forming the emitter cap layer 106.

An insulating film 122 is deposited to cover the entire surface of the semi-insulating substrate 101 provided with the semiconductor layers described above. Contact holes 123A, 123B and 123C are provided in portions of the insulating film 122 located on the emitter contact layer 107, the base layer 104 (i.e., a portion on which the emitter layer 105 is not formed) and the second sub-collector layer 108 (i.e., a portion on which the collector layer 103 is not formed), respectively.

This embodiment is characterized in that an interconnection 115A is directly extended from the emitter contact layer 107 through the contact hole 123A, an interconnection 115B is directly extended from the base layer 104 through the contact hole 123B, and an interconnection 115C is directly extended from the second sub-collector layer 108 through the contact hole 123C. That is, the interconnection 115A has a portion serving as an emitter electrode, the interconnection 115B has a portion serving as a base electrode, and the interconnection 115C has a portion serving as a collector electrode. Each of the interconnections 115A, 115B and 115C has a Pt/Ti/Pt/Au/Ti structure, for example.

In a portion of the emitter contact layer 107 connected to the interconnection 115A (i.e., a portion serving as an emitter electrode), a first Pt alloyed reaction layer 116 is formed. The first Pt alloyed reaction layer 116 is formed by a reaction between Pt forming the bottom layer of the interconnection 115A and InGaAs forming the emitter contact layer 107 under heat treatment. The first Pt alloyed reaction layer 116 is formed only inside the emitter contact layer 107.

In a portion of the base layer 104 connected to the interconnection 115B (i.e., a portion serving as base electrode), a second Pt alloyed reaction layer 117 is formed. The second Pt alloyed reaction layer 117 is formed by a reaction between Pt forming the bottom layer of the interconnection 115B and GaAs forming the base layer 104 under heat treatment. The second Pt alloyed reaction layer 117 is formed only inside the base layer 104.

In a portion of the second sub-collector layer 108 connected to the interconnection 115C (i.e., a portion serving as a collector electrode), a third Pt alloyed reaction layer 118 is formed. The third Pt alloyed reaction layer 118 is formed by a reaction between Pt forming the bottom layer of the interconnection 115C and InGaAs forming the second sub-collector layer 108 under heat treatment. The third Pt alloyed reaction layer 118 is formed only inside the second sub-collector layer 108.

In this embodiment, to electrically isolate HBTs (unit HBTs) from each other, an isolation region 141 is formed in the periphery of each HBT region to reach the substrate 101 through the stack of the second sub-collector layer 108 and the first sub-collector layer 102.

Hereinafter, a method for fabricating an HBT illustrated in FIG. 5 according to this embodiment will be described with reference to the drawings.

FIGS. 6A through 6C, FIGS. 7A and 7B and FIG. 8 are cross-sectional views showing respective process steps of the method for fabricating an HBT of this embodiment.

Figure 6A:
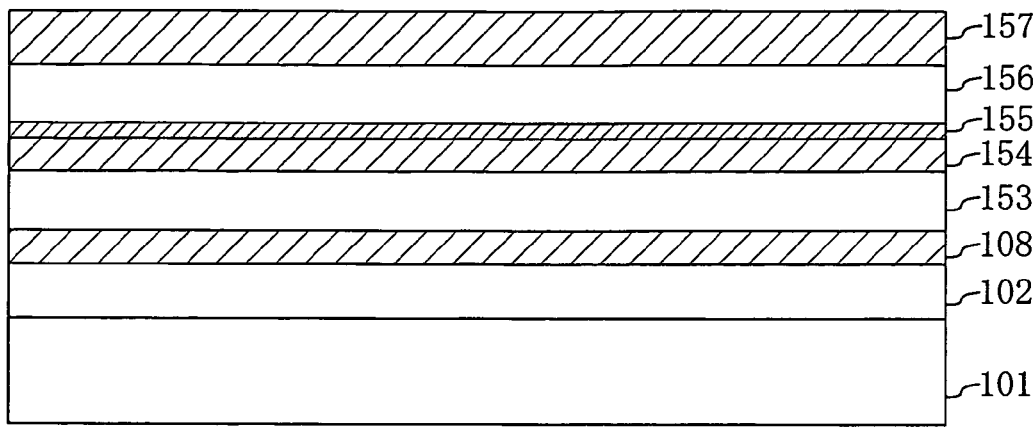
FIGS. 6A through 6C are cross-sectional views showing respective process steps of a method for fabricating an HBT according to the second embodiment.

First, as shown in FIG. 6A, a first sub-collector layer 102 made of an n-type GaAs layer doped with an n-type impurity at a high concentration of, for example, about $5 \times 10^{18}$ cm$^{-3}$, a second sub-collector layer 108 made of an n-type InGaAs layer doped with an n-type impurity at a high concentration of, for example, about $1 \times 10^{19}$ cm$^{-3}$, a collector-layer film 153 made of an n-type GaAs layer doped with an n-type impurity at a low concentration of, for example, about $1 \times 10^{16}$ cm$^{-3}$, a base-layer film 154 made of a p-type GaAs layer doped with a p-type impurity at a high concentration of, for example, about $4 \times 10^{19}$ cm$^{-3}$, an emitter-layer film 155 made of an n-type InGaP (specifically, $In_{0.48}Ga_{0.52}P$ having an In content of about 48%) layer doped with an n-type impurity at a concentration of, for example, about $3 \times 10^{17}$ cm$^{-3}$, an emitter-cap-layer film 156 made of an n-type GaAs layer doped with an n-type impurity at a high concentration of, for example, about $3 \times 10^{18}$ cm$^{-3}$, and an emitter-contact-layer film 157 made of an n-type InGaAs layer doped with an n-type impurity at a high concentration of, for example, about $1 \times 10^{19}$ cm$^{-3}$ are formed in this order by crystal growth processes such as MBE or MOCVD over a semi-insulating substrate 101 made of, for example, GaAs. As the collector-layer film 153, an i-type GaAs layer may be formed. The bandgap of $In_{0.48}Ga_{0.52}P$ forming the emitter-layer film 155 is larger than that of GaAs forming the base-layer film 154. The bandgap of InGaAs forming the emitter-contact-layer film 157 is smaller than that of GaAs forming the emitter-cap-layer film 156.

Figure 6B:
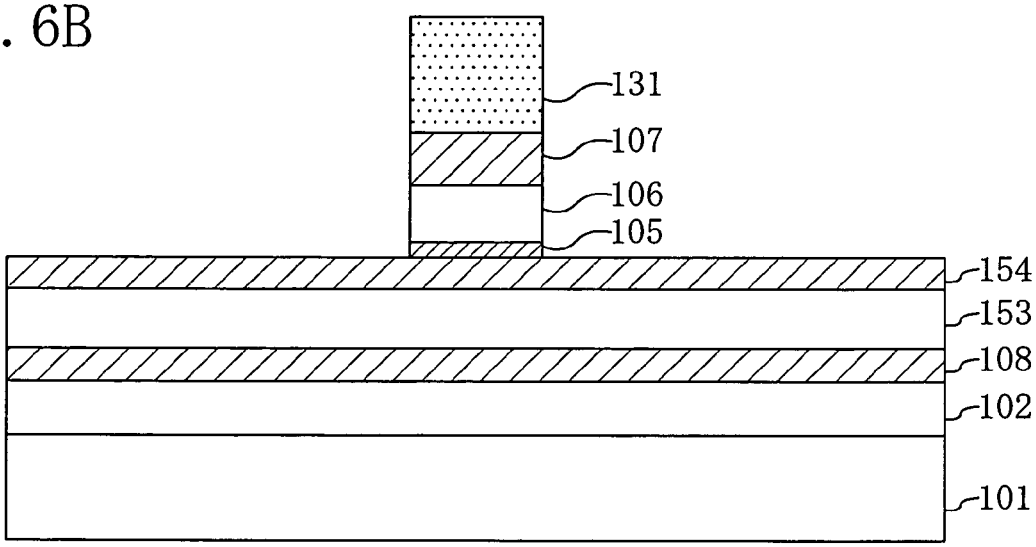

Next, as shown in FIG. 6B, the emitter-contact-layer film 157, the emitter-cap-layer film 156 and the emitter-layer film 155 are sequentially patterned by dry etching or wet etching using a photoresist pattern 131 protecting an emitter region as a mask. In this manner, an emitter island region made of the stack of an emitter layer 105, an emitter cap layer 106 and an emitter contact layer 107 is formed and a base-electrode region of the base-layer film 154 is exposed. At this time, the base-layer film 154 made of GaAs layer is hardly etched.

Figure 6C:
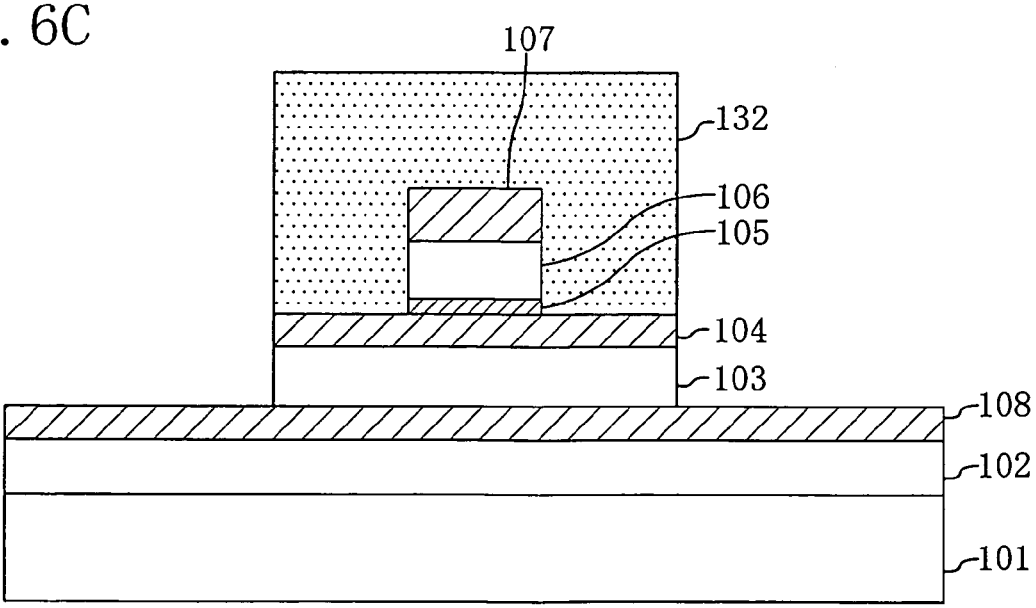

Then, the photoresist pattern 131 is removed. Thereafter, as shown in FIG. 6C, the base-layer film 154 and the collector-layer film 153 are sequentially patterned by dry etching or wet etching using a photoresist pattern 132 protecting a base region including the emitter region as a mask. In this manner, a base island region made of the stack of a collector layer 103 and a base layer 104 is formed and a collector-electrode region of the second sub-collector layer 108 is exposed. At this time, the second sub-collector layer 108 made of InGaAs is hardly etched. That is, the second sub-collector layer 108 of an InGaAs layer serves as an etching stopper, so that the etching accuracy in forming the base island region is greatly enhanced, as compared to conventional techniques.

Figure 7A:
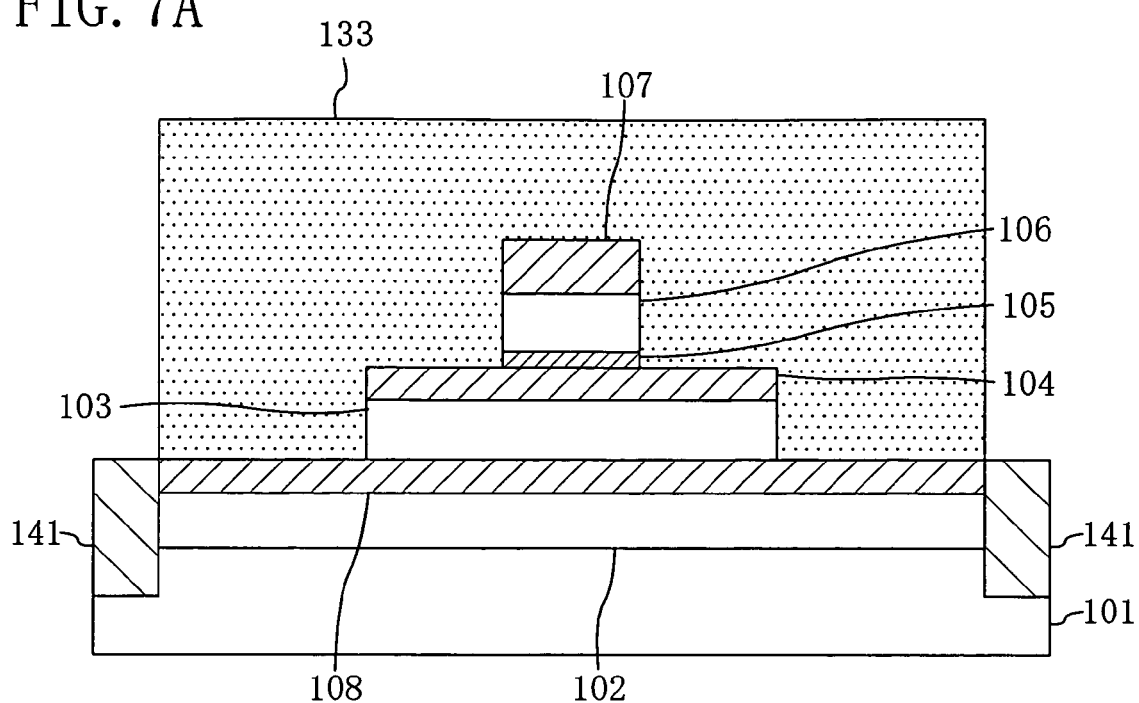
FIGS. 7A and 7B are cross-sectional views showing respective process steps of the method for fabricating the HBT of the second embodiment.

Thereafter, the photoresist pattern 132 is removed. Then, as shown in FIG. 7A, helium (He) ions, for example, are implanted in the second sub-collector layer 108 and the first sub-collector layer 102 using a photoresist pattern 133 protecting unit HBT cells (i.e., HBT regions) as a mask, thereby forming an isolation region 141. In this manner, the unit HBT cells are isolated from each other.

Figure 7B:
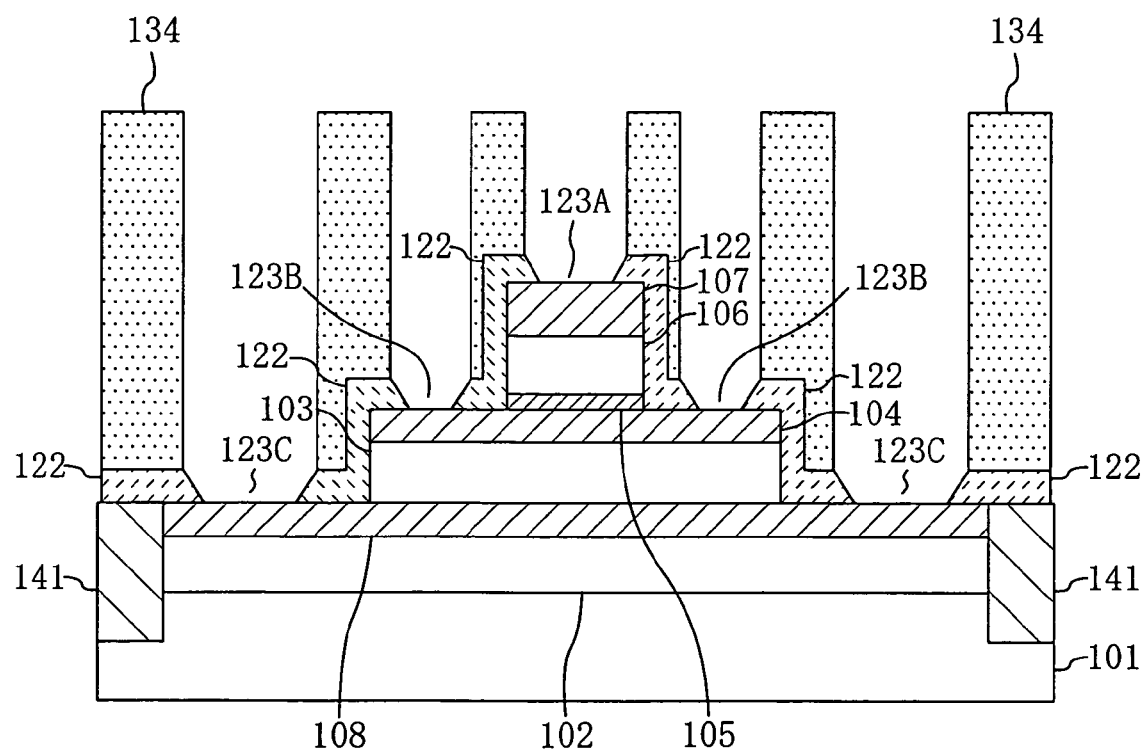

Subsequently, the photoresist pattern 133 is removed. Then, as shown in FIG. 7B, an insulating film 122 made of, for example, a SiO$_2$ film is deposited to cover the entire surface of the semi-insulating substrate 101. Thereafter, a photoresist pattern 134 having openings on the emitter contact layer 107, the base layer 104 (i.e., a portion on which the emitter layer 105 is not formed) and the second sub-collector layer 108 (i.e., a portion on which the collector layer 103 is not formed) is formed. Subsequently, dry etching or wet etching is performed on the insulating film 122 using the photoresist pattern 134 as a mask, thereby forming contact holes 123A, 123B and 123C reaching the emitter contact layer 107, the base layer 104 (i.e., a portion on which the emitter layer 105 is not formed) and the second sub-collector layer 108 (i.e., a portion on which the collector layer 103 is not formed), respectively.

Figure 8:
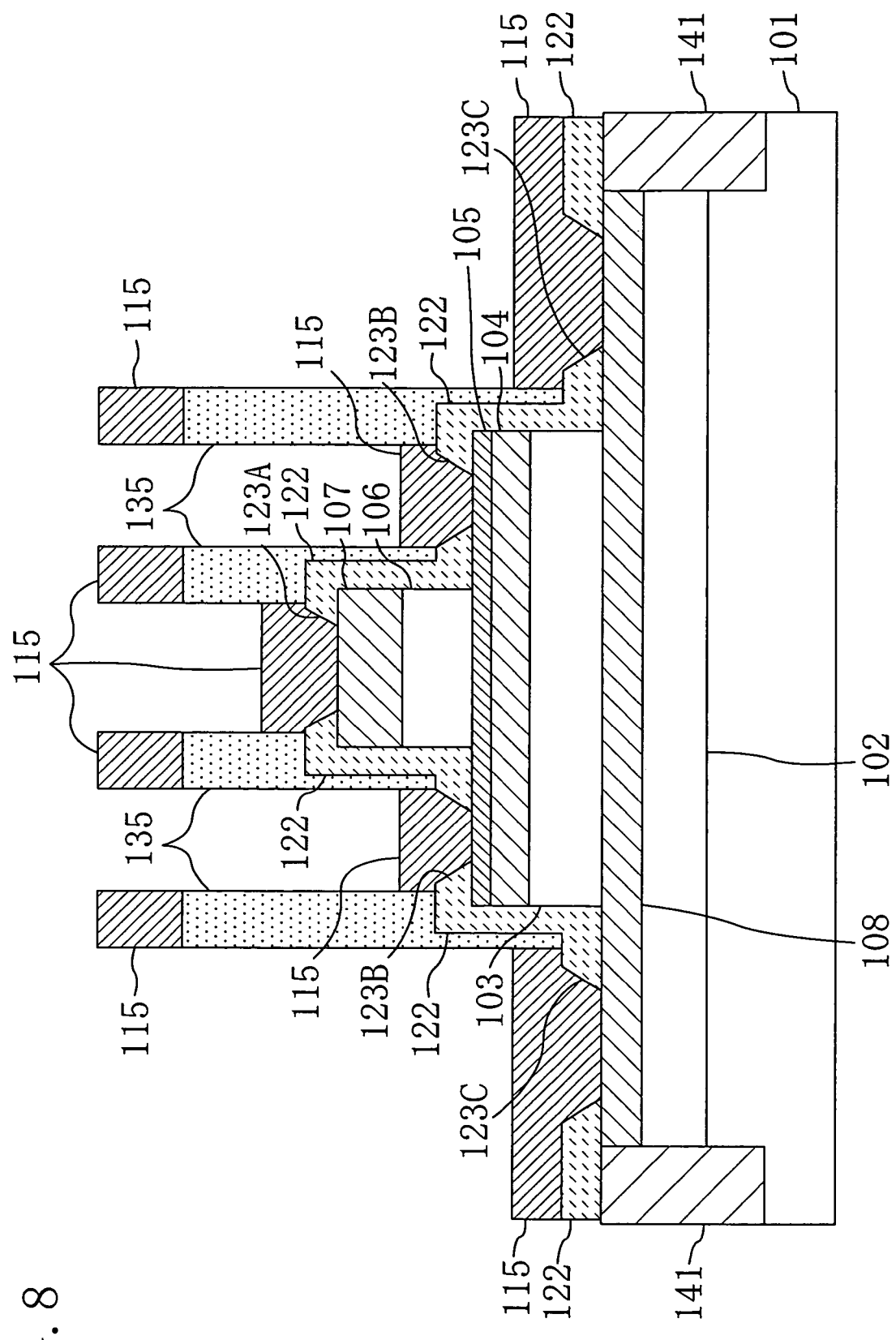
FIG. 8 is a cross-sectional view showing a process step of the method for fabricating the HBT of the second embodiment.

Then, the photoresist pattern 134 is removed. Thereafter, as shown in FIG. 8, a photoresist pattern 135 having openings in interconnection regions including the contact holes 123A, 123B and 123C is formed. Subsequently, an interconnection conductive film 115 is formed by, for example, vapor deposition to cover the entire surface of the semi-insulating substrate 101. At this time, the interconnection conductive film 115 has a structure in which a Pt layer, a Ti layer, a Pt layer, an Au layer and a Ti layer are stacked in this order, for example. Subsequently, the photoresist pattern 135 and its overlying interconnection conductive film 115 are removed by lift-off, thereby forming an interconnection 115A extended from the emitter contact layer 107 through the contact hole 123A, an interconnection 115B extended from the base layer 104 through the contact hole 123B and an interconnection 115C extended from the second sub-collector layer 108 through the contact hole 123C. That is, in this embodiment, the interconnections 115A, 115B and 115C also serve as an emitter electrode, a base electrode and a collector electrode, respectively.

Thereafter, heat treatment for inactivating the isolation region (i.e., an isolation region formed by ion implantation) 141 for electrically isolating unit HBT cells from each other is performed. In this embodiment, with this heat treatment, a metal (specifically, Pt) forming the bottom layer of the interconnection 115A and a material forming a portion of the emitter contact layer 107 in contact with the interconnection 115A react with each other. In the same manner, a metal (specifically, Pt) forming the bottom layer of the interconnection 115B and a material forming a portion of the base layer 104 in contact with the interconnection 115B react with each other. In addition, a metal (specifically, Pt) forming the bottom layer of the interconnection 115C and a material forming a portion of the second sub-collector layer 108 in contact with the interconnection 115C react with each other. In this manner, as shown in FIG. 5, a first Pt alloyed reaction layer 116 is formed in a portion of the emitter contact layer 107 located under the interconnection 115A, a second Pt alloyed reaction layer 117 is formed in a portion of the base layer 104 located under the interconnection 115B, and a third Pt alloyed reaction layer 118 is formed in a portion of the second sub-collector layer 108 located under the interconnection 115C. The first Pt alloyed reaction layer 116 is formed only inside the emitter contact layer 107. The second Pt alloyed reaction layer 117 is formed only inside the base layer 104. The third Pt alloyed reaction layer 118 is formed only inside the second sub-collector layer 108.

In the method described above, an HBT illustrated in FIG. 5 of this embodiment is completed.

In the second embodiment, a high-concentration n-type semiconductor of a material having a small bandgap is used for each of the emitter contact layer 107 and the second sub-collector layer 108. Accordingly, an Ohmic contact is easily formed between a metal used for the interconnection (emitter extended interconnection) 115A extended from the emitter contact layer 107 and the emitter contact layer 107. In addition, an Ohmic contact is also easily formed between a metal used for the interconnection (collector extended interconnection) 115C extended from the second sub-collector layer 108 and the second sub-collector layer 108. That is, not only the interconnection (base extended interconnection) 115B also serving as a base electrode but also the emitter extended interconnection 115A also serving as an emitter electrode and the collector extended interconnection 115C also serving as a collector electrode are formed. As a result, process steps for forming an emitter electrode, a base electrode and a collector electrode, which are performed separately from process steps for forming interconnections in conventional techniques, are omitted, thus reducing fabrication cost.

In conventional techniques, it is necessary to consider three misalignments: a misalignment between an emitter contact layer and an emitter electrode; a misalignment between an emitter electrode and a contact hole; and a misalignment between a contact hole and an interconnection.

On the other hand, in the second embodiment, in determining the emitter size, it is sufficient to consider only two misalignments: a misalignment between the emitter contact layer 107 and the contact hole 123A; and a misalignment between the contact hole 123A and the emitter extended interconnection 115A. Accordingly, the emitter size is reduced as compared to conventional techniques. This allows higher performance of HBTs, i.e., enhancement of high-frequency characteristics.

Embodiment 3

Hereinafter, an HBT and a method for fabricating the HBT according to a third embodiment of the present invention will be described with reference to the drawings.

Figure 9:
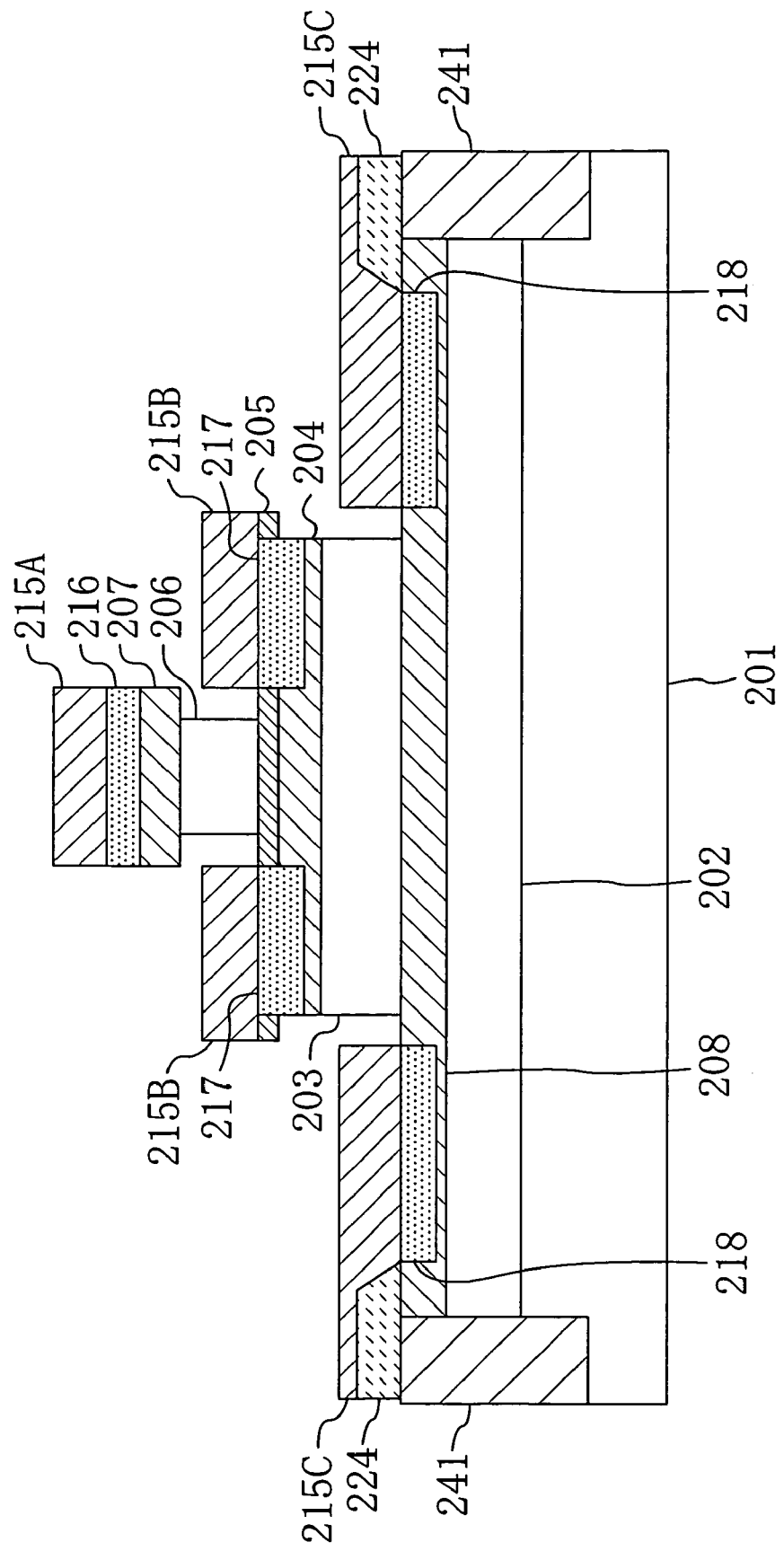
FIG. 9 is a cross-sectional view illustrating a structure of an HBT according to a third embodiment of the present invention.

FIG. 9 is a cross-sectional view illustrating a structure of the HBT of this embodiment.

As illustrated in FIG. 9, a first sub-collector layer 202 made of an n-type GaAs layer doped with an n-type impurity at a high concentration of, for example, about $5 \times 10^{18}$ cm$^{-3}$ is formed on a semi-insulating substrate 201 made of, for example, GaAs. A second sub-collector layer 208 made of an n-type InGaAs layer doped with an n-type impurity at a high concentration of, for example, about $1 \times 10^{19}$ cm$^{-3}$ is formed on the first sub-collector layer 202. The bandgap of InGaAs forming the second sub-collector layer 208 is smaller than that of GaAs forming the first sub-collector layer 202.

On a given region of the second sub-collector layer 208, a collector layer 203 made of an n-type GaAs layer doped with an n-type impurity at a low concentration of, for example, about $1 \times 10^{16}$ cm$^{-3}$, a base layer 204 made of a p-type GaAs layer doped with an n-type impurity at a high concentration of, for example, about $4 \times 10^{19}$ cm$^{-3}$, and an emitter layer 205 made of an n-type InGaP (specifically, $In_{0.48}Ga_{0.52}P$ having an In content of about 48%) layer doped with an n-type impurity at a concentration of, for example, about $3 \times 10^{17}$ cm$^{-3}$, are stacked in this order. That is, the stack of the collector layer 203, the base layer 204 and the emitter layer 205 is formed into an island shape on the second sub-collector layer 208. The area of the emitter layer 205 is larger than that of the base layer 204. Accordingly, the edge of the emitter layer 205 projects from the base layer 204 to form an eave. As the collector layer 203, an i-type GaAs layer may be used. The bandgap of $In_{0.48}Ga_{0.52}P$ forming the emitter layer 205 is larger than that of GaAs forming the base layer 204.

On a given region of the emitter layer 205, an emitter cap layer 206 made of an n-type GaAs layer doped with an n-type impurity at a high concentration of, for example, about $3 \times 10^{18}$ cm$^{-3}$ and an emitter contact layer 207 made of an n-type InGaAs layer doped with an n-type impurity at a high concentration of, for example, about $1 \times 10^{19}$ cm$^{-3}$ are stacked in this order. That is, the stack of the emitter cap layer 206 and the emitter contact layer 207 is formed into an island shape on the emitter layer 205. The area of the emitter contact layer 207 is larger than that of the emitter cap layer 206. Accordingly, the edge of the emitter contact layer 207 projects from the emitter cap layer 206 to form an eave. The bandgap of InGaAs forming the emitter contact layer 207 is smaller than that of GaAs forming the emitter cap layer 206.

This embodiment is characterized in that an interconnection (emitter extended interconnection) 215A extended from the emitter contact layer 207, an interconnection (base extended interconnection) 215B extended from the emitter layer 205 and an interconnection (collector extended interconnection) 215C extended from the second sub-collector layer 208 are formed in a self-aligned manner. The emitter extended interconnection 215A, the base extended interconnection 215B and the collector extended interconnection 215C are directly extended from the emitter contact layer 207, the emitter layer 205 and the second sub-collector layer 208. In other words, the emitter extended interconnection 215A, the base extended interconnection 215B and the collector extended interconnection 215C also serve as an emitter electrode, a base electrode and a collector electrode, respectively.

Figure 10A:
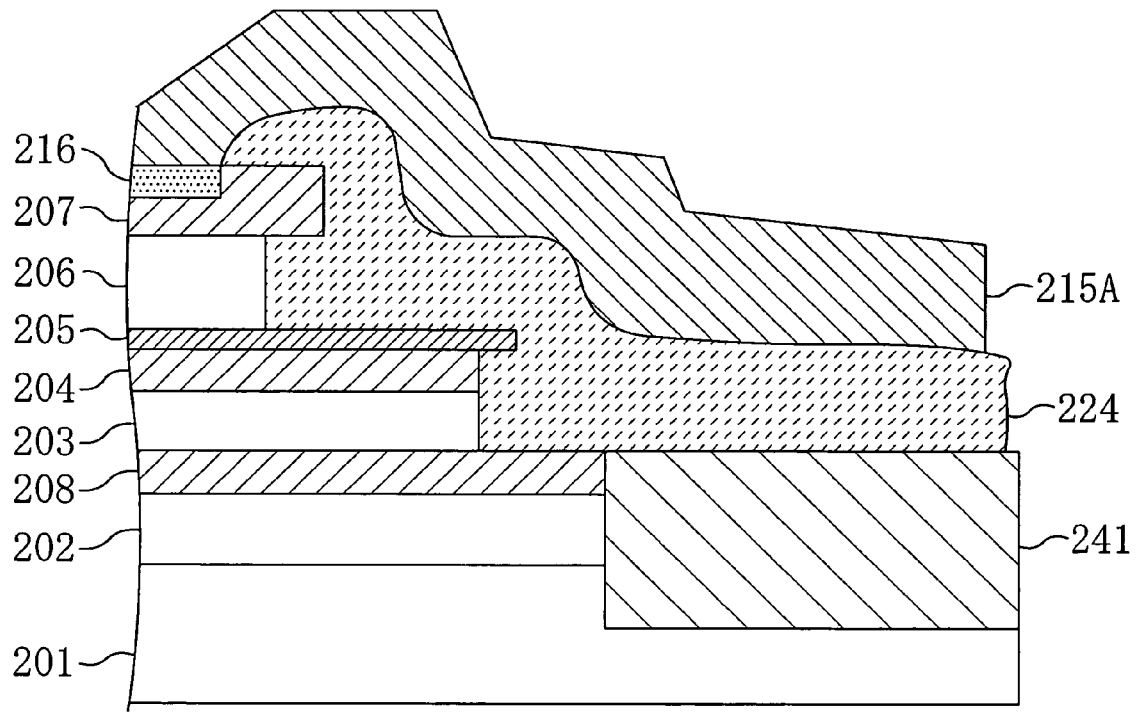
FIG. 10A is a cross-sectional view illustrating a main portion of the HBT of the third embodiment in the extension direction of an emitter extended interconnection.
Figure 10B:
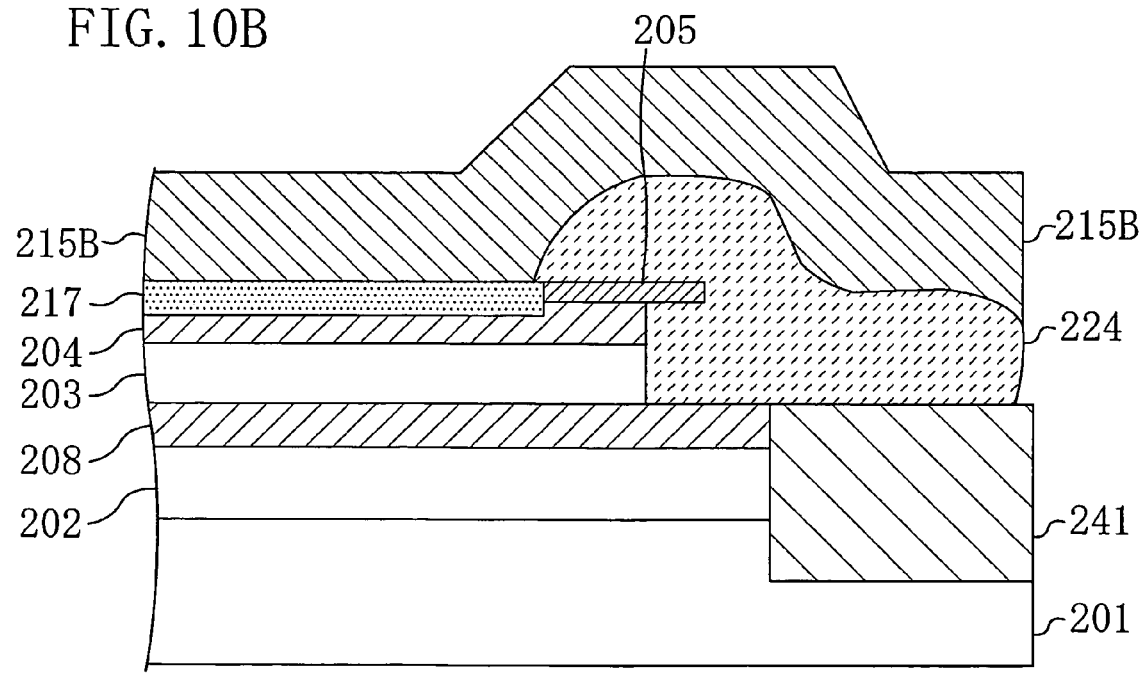
FIG. 10B is a cross-sectional view illustrating a main portion of the HBT of the third embodiment in the extension direction of a base extended interconnection.

FIG. 10A is a cross-sectional view illustrating a main portion of the HBT of this embodiment in the extension direction of the emitter extended interconnection 215A. FIG. 10B is a cross-sectional view illustrating a main portion of the HBT of this embodiment in the extension direction of the base extended interconnection 215B.

As illustrated in FIGS. 10A and 10B, the eave-shaped edge of the emitter contact layer 207 in the extension direction of the emitter extended interconnection 215A and the eave-shaped edge of the emitter layer 205 in the extension direction of the base extended interconnection 215B are covered with an insulating film 224 made of, for example, a tetraethylorthosilicate (TEOS) film. In this manner, it is possible to extend the emitter extended interconnection 215A and the base extended interconnection 215B from the emitter contact layer 207 and the emitter layer 205, respectively, while preventing disconnection at steps (hereinafter, referred to as step disconnection).

In a portion of the emitter contact layer 207 connected to the interconnection 215A (a portion serving as an emitter electrode), a first Pt alloyed reaction layer 216 is formed. The first Pt alloyed reaction layer 216 is formed by a reaction between Pt forming the bottom layer of the interconnection 215A and InGaAs forming the emitter contact layer 207 under heat treatment. The first Pt alloyed reaction layer 216 is formed only inside the emitter contact layer 207.

In a portion of the emitter layer 205 connected to the interconnection 215B (i.e., a portion serving as base electrode), a second Pt alloyed reaction layer 217 is formed. The second Pt alloyed reaction layer 217 is formed by a reaction between Pt forming the bottom layer of the interconnection 215B and InGaP forming the emitter layer 205 under heat treatment. The second Pt alloyed reaction layer 217 penetrates through the emitter layer 205 to reach the base layer 204. Accordingly, the interconnection 215B (i.e., a portion serving as a base electrode) and the base layer 204 are in contact with each other through the second Pt alloyed reaction layer 217, thus ensuring formation of an Ohmic contact.

In a portion of the second sub-collector layer 208 connected to the interconnection 215C (i.e., a portion serving as a collector electrode), a third Pt alloyed reaction layer 218 is formed. The third Pt alloyed reaction layer 218 is formed by a reaction between Pt forming the bottom layer of the interconnection 215C and InGaAs forming the second sub-collector layer 208 under heat treatment. The third Pt alloyed reaction layer 218 is formed only inside the second sub-collector layer 208.

In this embodiment, to electrically isolate HBTs (unit HBTs) from each other, an isolation region 241 is formed in the periphery of each HBT region to reach the substrate 201 through the stack of the second sub-collector layer 208 and the first sub-collector layer 202.

Hereinafter, a method for fabricating an HBT illustrated in FIG. 9 and FIGS. 10A and 10B according to this embodiment will be described with reference to the drawings.

Figure 11A:
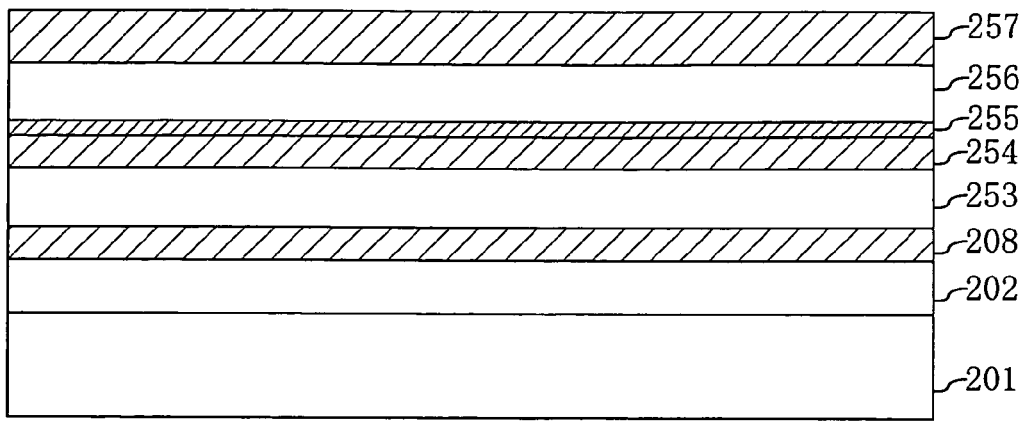
FIGS. 11A through 11C are cross-sectional views showing respective process steps of a method for fabricating an HBT according to the third embodiment.
Figure 11B:
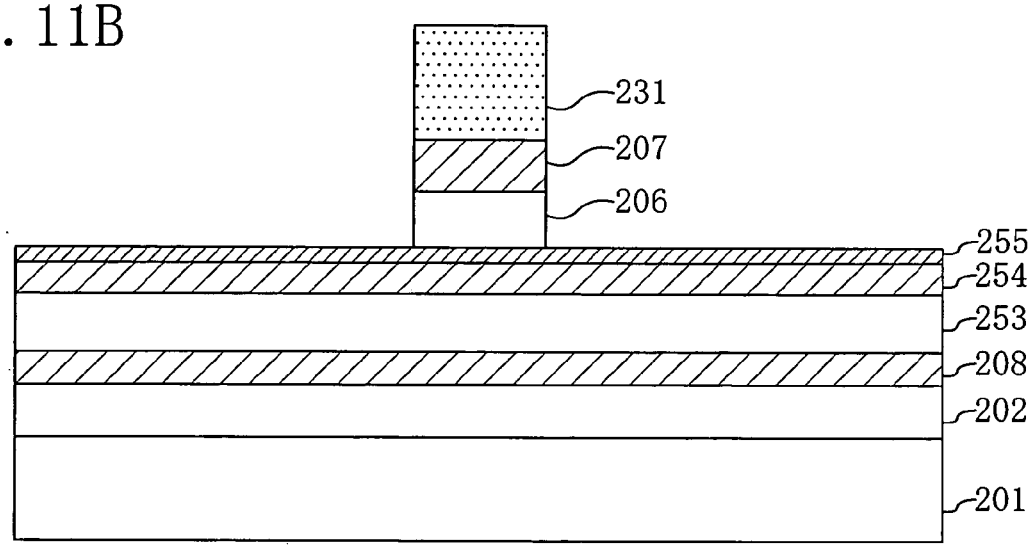
Figure 11C:
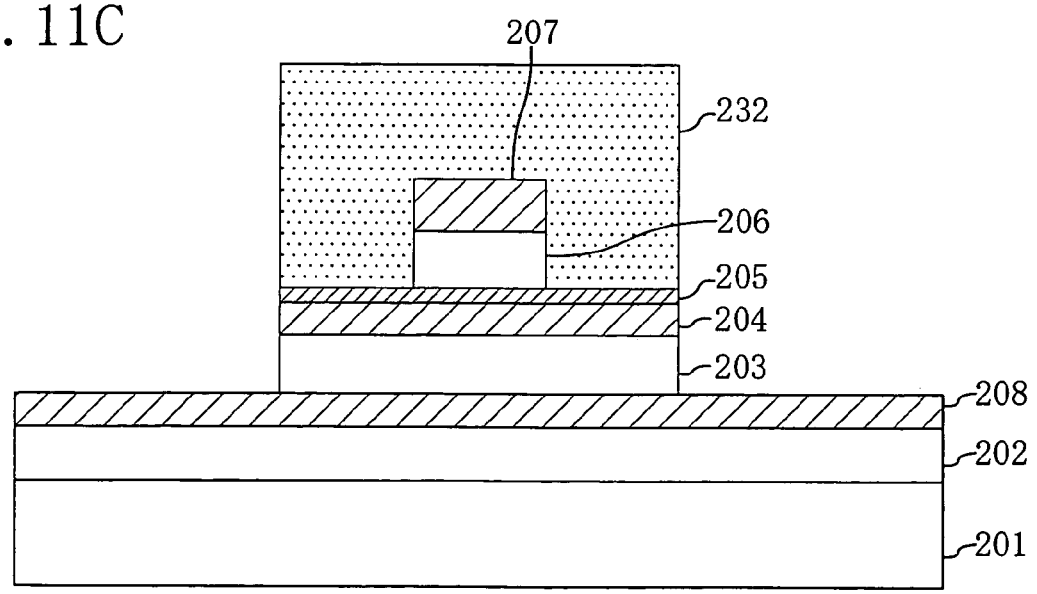
Figure 12A:
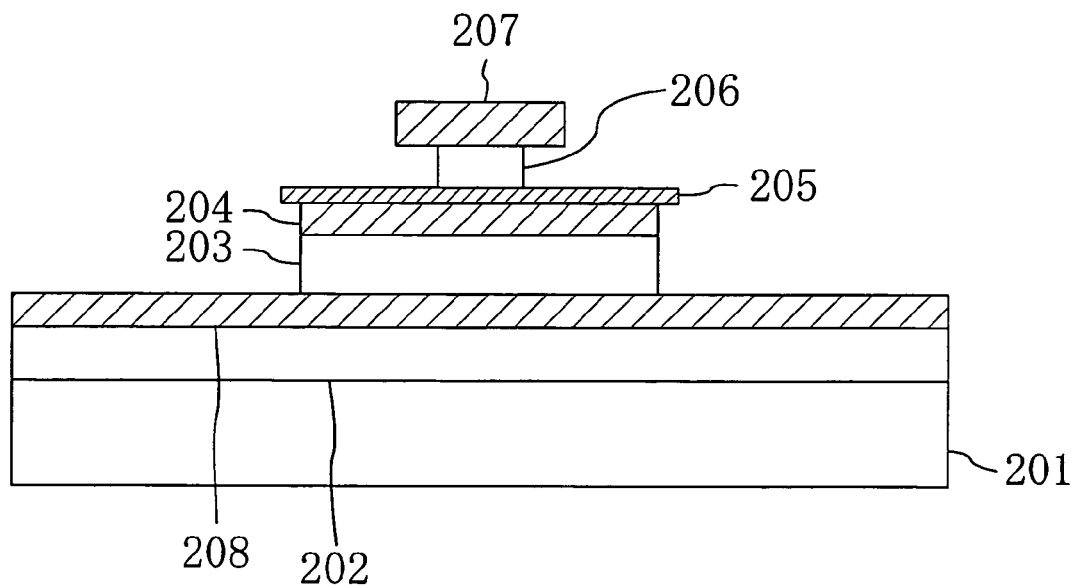
FIGS. 12A and 12B are cross-sectional views showing respective process steps of the method for fabricating the HBT of the third embodiment.
Figure 13A:
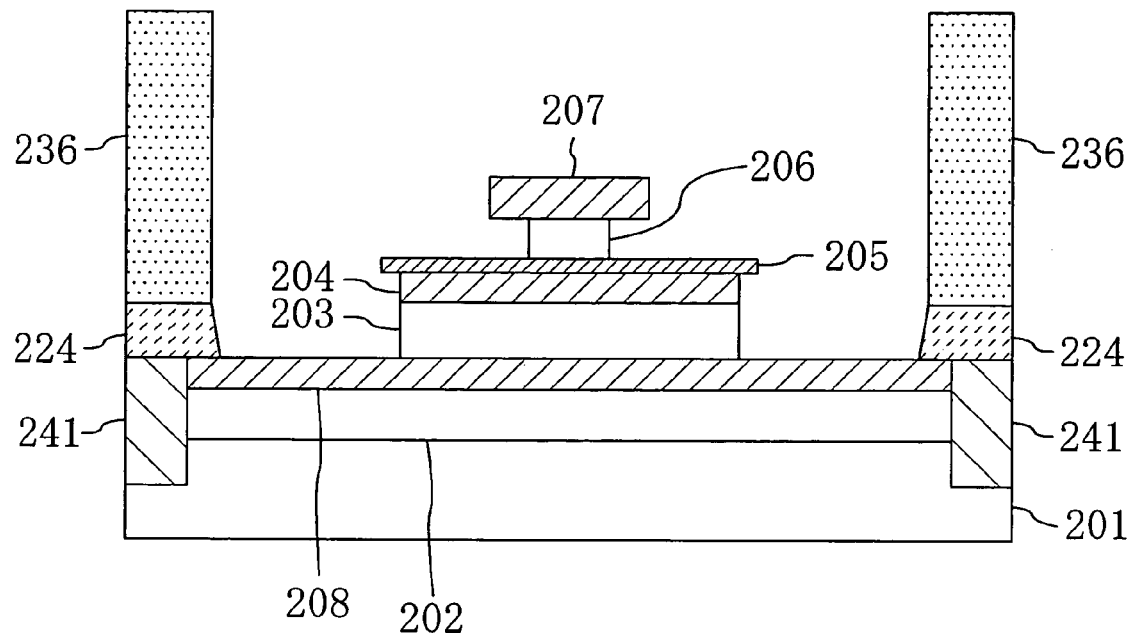
FIG. 13A is a cross-sectional view showing a process step of the method for fabricating the HBT of third embodiment.
Figure 13B:
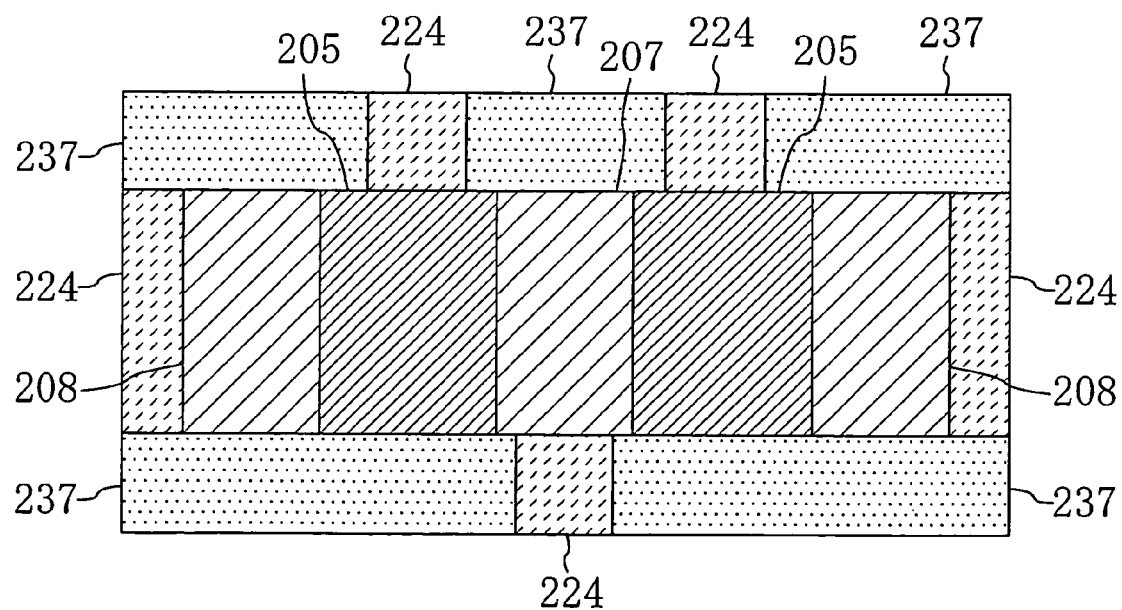
FIG. 13B is a plan view showing a process step of the method for fabricating the HBT of third embodiment.
Figure 14:
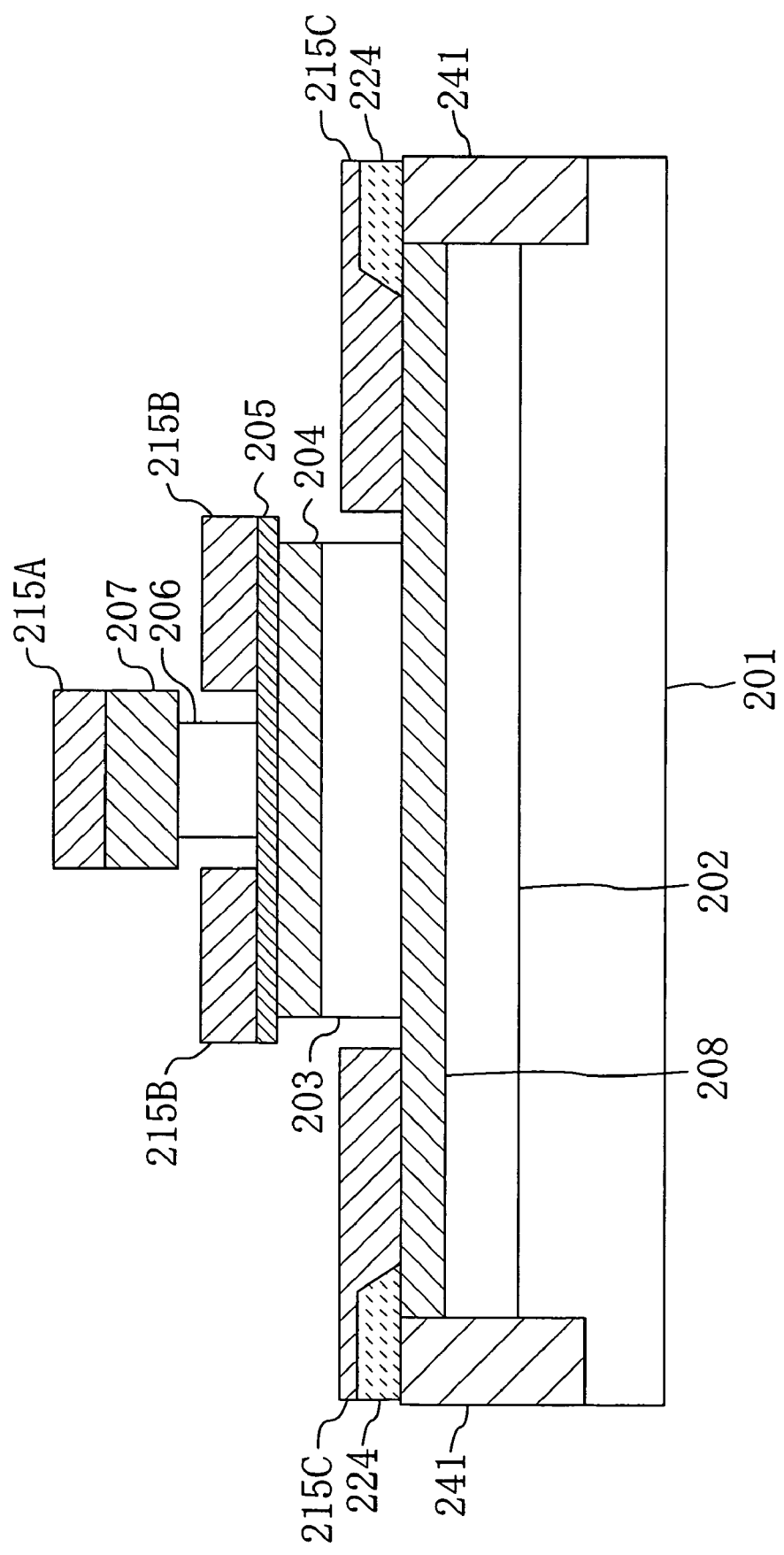
FIG. 14 is a cross-sectional view showing a process step of the method for fabricating the HBT of the third embodiment.
Figure 15A:
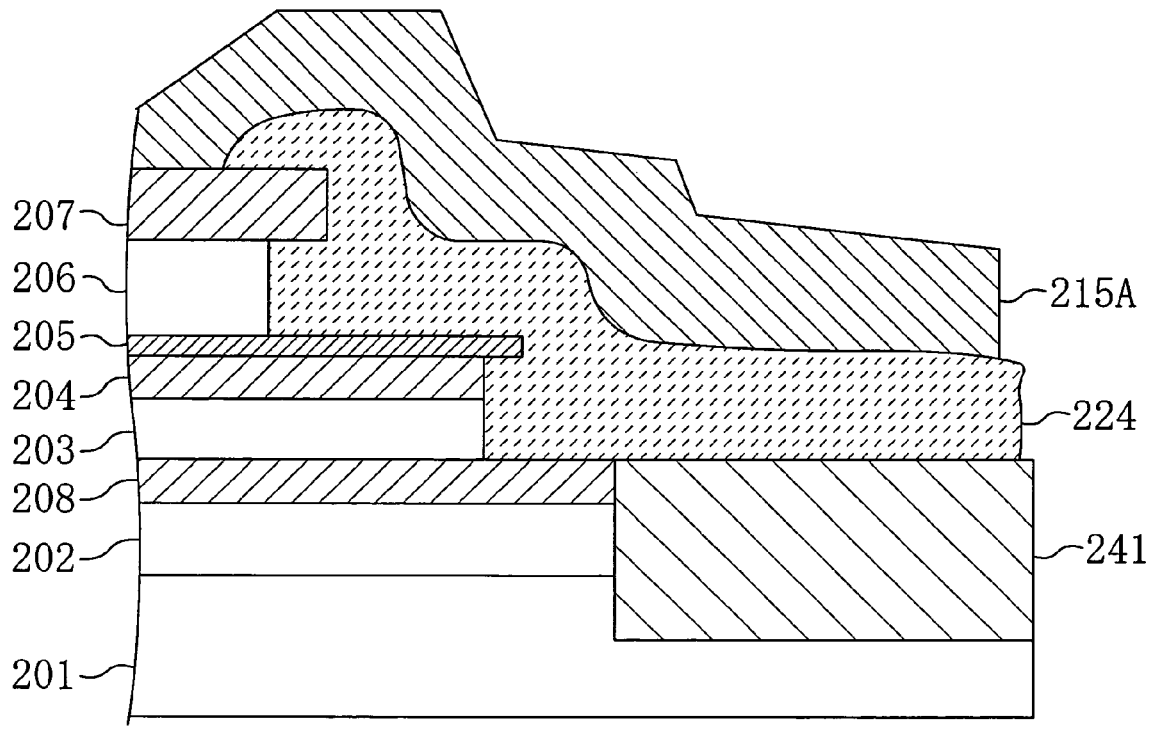
FIGS. 15A and 15B are cross-sectional views showing respective process steps of the method for fabricating the HBT of the third embodiment.
Figure 15B:
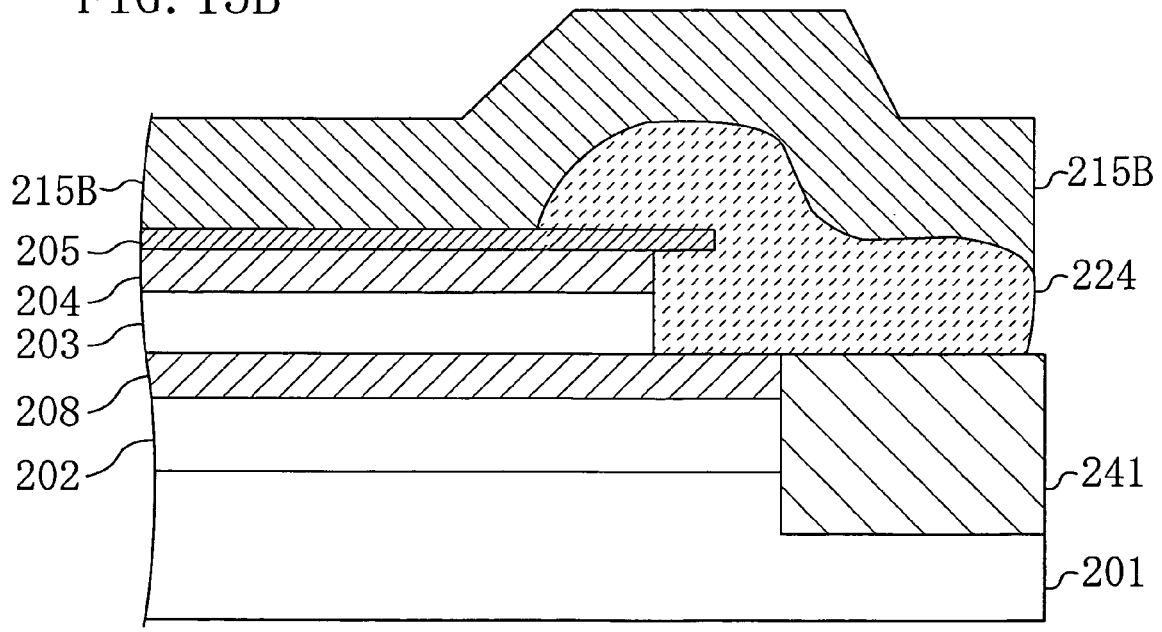

FIGS. 11A through 11C, FIGS. 12A and 12B, FIG. 13A, FIG. 14 and FIGS. 15A and 15B are cross-sectional views showing respective process steps of the method for fabricating an HBT of this embodiment. FIG. 13B is a plan view showing a process step of the method for fabricating an HBT of this embodiment. FIG. 15A is a cross-sectional view showing a process step with respect to a main portion of the HBT of this embodiment in the extension direction of the emitter extended interconnection. FIG. 15B is a cross-sectional view showing a process step with respect to a main portion of the HBT of this embodiment in the extension direction of the base extended interconnection.

First, as shown in FIG. 11A, a first sub-collector layer 202 made of an n-type GaAs layer doped with an n-type impurity at a high concentration of, for example, about $5 \times 10^{18}$ cm$^{-3}$, a second sub-collector layer 208 made of an n-type InGaAs layer doped with an n-type impurity at a high concentration of, for example, about $1 \times 10^{19}$ cm$^{-3}$, a collector-layer film 253 made of an n-type GaAs layer doped with an n-type impurity at a low concentration of, for example, about $1 \times 10^{16}$ cm$^{-3}$, a base-layer film 254 made of a p-type GaAs layer doped with a p-type impurity at a high concentration of, for example, about $4 \times 10^{19}$ cm$^{-3}$, an emitter-layer film 255 made of an n-type InGaP (specifically, $In_{0.48}Ga_{0.52}P$ having an In content of about 48%) layer doped with an n-type impurity at a concentration of, for example, about $3 \times 10^{17}$ cm$^{-3}$ an emitter-cap-layer film 256 made of an n-type GaAs layer doped with an n-type impurity at a high concentration of, for example, about $3 \times 10^{18}$ cm$^{-3}$, and an emitter-contact-layer film 257 made of an n-type InGaAs layer doped with an n-type impurity at a high concentration of, for example, about $1 \times 10^{19}$ cm$^{-3}$ are formed in this order by crystal growth processes such as MBE or MOCVD over a semi-insulating substrate 201 made of, for example, GaAs. As the collector-layer film 253, an i-type GaAs layer may be formed. The bandgap of $In_{0.48}Ga_{0.52}P$ forming the emitter-layer film 255 is larger than that of GaAs forming the base-layer film 254. The bandgap of InGaAs forming the emitter-contact-layer film 257 is smaller than that of GaAs forming the emitter-cap-layer film 256.

Next, as shown in FIG. 11B, the emitter-contact-layer film 257 and the emitter-cap-layer film 256 are sequentially patterned by dry etching or wet etching using a photoresist pattern 231 protecting an emitter region as a mask. In this manner, an emitter island region made of the stack of an emitter cap layer 206 and an emitter contact layer 207 is formed and a base-electrode region of the emitter-layer film 255 is exposed. At this time, the emitter-layer film 255 made of $In_{0.48}Ga_{0.52}P$ is hardly etched.

Then, the photoresist pattern 231 is removed. Thereafter, as shown in FIG. 11C, dry etching or wet etching is performed using a photoresist pattern 232 protecting an base region including an emitter region as a mask, thereby sequentially patterning the emitter-layer film 255, the base-layer film 254 and the collector-layer film 253. In this manner, a base island region made of the stack of a collector layer 203, a base layer 204 and an emitter layer 205 is formed and a collector-electrode region of the second sub-collector layer 208 is exposed. At this time, the second sub-collector layer 208 made of InGaAs is hardly etched. That is, the second sub-collector layer 208, which is an InGaAs layer, serves as an etching stopper, so that the etching accuracy in forming the base island region is greatly enhanced, as compared to conventional techniques.

Then, the photoresist pattern 232 is removed. Thereafter, as shown in FIG. 12A, side etching is selectively performed on the emitter cap layer 206, the base layer 204 and the collector layer 203 with, for example, a citric acid-based etching solution. In this manner, the edge of the emitter contact layer 207 projects from the emitter cap layer 206 to form an eave and the edge of the emitter layer 205 projects from the base layer 204 to form an eave. At this time, the emitter contact layer 207 and the second sub-collector layer 208 made of InGaAs and the emitter layer 205 made of InGaP are hardly etched.

Figure 12B:
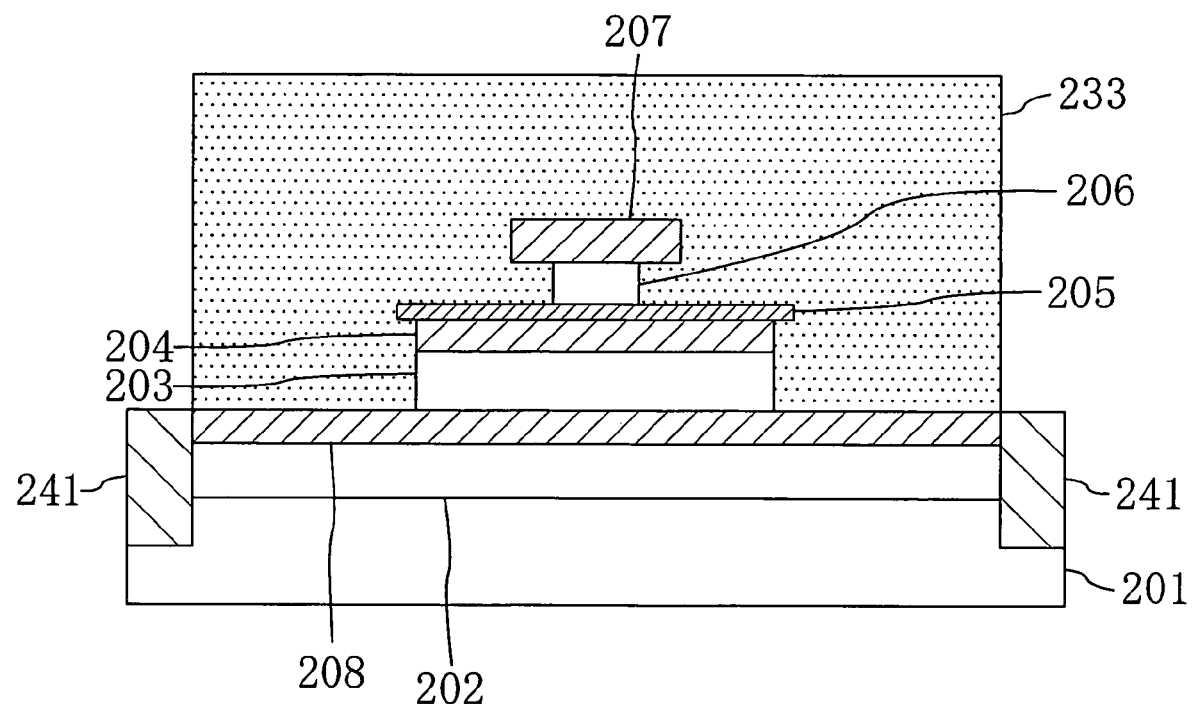

Then, as shown in FIG. 12B, helium (He) ions are implanted in the second sub-collector layer 208 and the first sub-collector layer 202 using a photoresist pattern 233 protecting unit HBT cells (i.e., HBT regions) as a mask, thereby forming an isolation region 241. In this manner, the unit HBT cells are isolated from each other.

Subsequently, the photoresist pattern 233 is removed. Then, an insulating film 224 made of, for example, a TEOS film is formed by, for example, chemical vapor deposition (CVD) to cover the entire surface of the semi-insulating substrate 201, thereby covering the eave-shaped edge of the emitter contact layer 207 and the eave-shaped edge of the emitter layer 205 with the insulating film 224. Thereafter, as shown in FIG. 13A, a photoresist pattern 236 covering a given region (which is at least the eave-shaped edge of the emitter contact layer 207 in the extension direction of the emitter extended interconnection 215A (see, FIG. 15A) and the eave-shaped edge of the emitter layer 205 in the extension direction of the base extended interconnection 215B (see FIG. 15B)) is formed. Subsequently, dry etching or wet etching is performed on the insulating film 224 using the photoresist pattern 236 as a mask. In this manner, a portion of the insulating film 224 covering the eave-shaped edge of the emitter contact layer 207 except for the extension direction of the emitter extended interconnection 215A is removed. In addition, a portion of the insulating film 224 covering the eave-shaped edge of the emitter layer 205 except for the extension direction of the base extended interconnection 215B is also removed.

Then, as shown in FIG. 13B, a photoresist pattern 237 having openings on the emitter contact layer 207, the emitter layer 205 (i.e., a region outside the emitter contact layer 207), and the second sub-collector layer 208 (i.e., a region outside the emitter layer 205) and portions of the insulating film 224 in the extension direction of the emitter extended interconnection 215A, the extension direction of the base extended interconnection 215B and the extension direction of the collector extended interconnection 215C (see FIG. 9) is formed. Thereafter, an interconnection conductive film 215 is formed by, for example, vapor deposition to cover the entire surface of the semi-insulating substrate 201. At this time, the interconnection conductive film 215 has a structure in which a Pt layer, a Ti layer, a Pt layer, an Au layer and a Ti layer are stacked in this order, for example. Subsequently, the photoresist pattern 237 and its overlying interconnection conductive film 215 are removed by lift-off. In this manner, as shown in FIG. 14, FIGS. 15A and 15B, an emitter extended interconnection 215A extended from the emitter contact layer 207, a base extended interconnection 215B extended from the emitter layer 205 and a collector extended interconnection 215C extended from the second sub-collector layer 208 are formed. That is, in this embodiment, the interconnections 215A, 215B and 215C also serve as an emitter electrode, a base electrode and a collector electrode, respectively.

This embodiment is characterized in that the edge of the emitter contact layer 207 projects from the emitter cap layer 206 to form an eave and the edge of the emitter layer 205 projects from the base layer 204 to form an eave, so that an emitter extended interconnection 215A also serving as an emitter electrode, a base extended interconnection 215B also serving as a base electrode and a collector extended interconnection 215C also serving as a collector electrode are formed in a self-aligned manner on the emitter contact layer 207, the emitter layer 205 and the second sub-collector layer 208, respectively. That is, the eave-shaped edge of the emitter contact layer 207 prevents a connection between the emitter extended interconnection 215A and the base extended interconnection 215B and the eave-shaped edge of the emitter layer 205 prevents a connection between the base extended interconnection 215B and the collector extended interconnection 215C. Accordingly, unlike conventional techniques, it is unnecessary to form contact holes in an insulating film covering a semiconductor layer so that extended interconnections are formed to be aligned with the contact holes.

As illustrated in FIGS. 15A and 15B, the eave-shaped edge of the emitter contact layer 207 in the extension direction of the emitter extended interconnection 215A and the eave-shaped edge of the emitter layer 205 in the extension direction of the base extended interconnection 215B are covered with the insulating film 224. Accordingly, it is possible to extend the emitter extended interconnection 215A and the base extended interconnection 215B from the emitter contact layer 207 and the emitter layer 205, respectively, while preventing step disconnection.

Thereafter, heat treatment for inactivating the isolation region (i.e., an isolation region formed by ion implantation) 241 for electrically isolating the unit HBT cells from each other is performed. In this embodiment, with this heat treatment, a metal (specifically, Pt) forming the bottom layer of the interconnection 215A and a material forming a portion of the emitter contact layer 207 in contact with the interconnection 215A react with each other. In the same manner, a metal (specifically, Pt) forming the bottom layer of the interconnection 215B and a material forming a portion of the emitter layer 205 in contact with the interconnection 215B react with each other. In addition, a metal (specifically, Pt) forming the bottom layer of the interconnection 215C and a material forming a portion of the second sub-collector layer 208 in contact with the interconnection 215C react with each other. In this manner, a first Pt alloyed reaction layer 216 is formed in a portion of the emitter contact layer 207 located under the interconnection 215A, a second Pt alloyed reaction layer 217 is formed in a portion of the emitter layer 205 located under the interconnection 215B, and a third Pt alloyed reaction layer 218 is formed in a portion of the second sub-collector layer 208 located under the interconnection 215C. In this manner, an HBT of this embodiment illustrated in FIG. 9 is completed. The first Pt alloyed reaction layer 216 is formed only inside the emitter contact layer 207. The second Pt alloyed reaction layer 217 penetrates through the emitter layer 205 to make an Ohmic contact with the base layer 204. The third Pt alloyed reaction layer 218 is formed only inside the second sub-collector layer 208.

In the third embodiment, a high-concentration n-type semiconductor of a material having a small bandgap is used for each of the emitter contact layer 207 and the second sub-collector layer 208. Accordingly, an Ohmic contact is easily formed between a metal used for the emitter extended interconnection 215A extended from the emitter contact layer 207 and the emitter contact layer 207. In addition, an Ohmic contact is also easily formed between a metal used for the collector extended interconnection 215C extended from the second sub-collector layer 208 and the second sub-collector layer 208. That is, not only the base extended interconnection 215B also serving as a base electrode but also the emitter extended interconnection 215A also serving as an emitter electrode and the collector extended interconnection 215C also serving as a collector electrode are formed. As a result, process steps for forming an emitter electrode, a base electrode and a collector electrode, which are performed separately from process steps for forming interconnections in conventional techniques, are omitted, thus reducing fabrication cost.

In conventional techniques, it is necessary to consider three misalignments: a misalignment between an emitter contact layer and an emitter electrode; a misalignment between an emitter electrode and a contact hole; and a misalignment between a contact hole and an interconnection.

On the other hand, in the third embodiment, the interconnections such as the emitter extended interconnection 215A are formed in a self-aligned manner, i.e., the emitter extended interconnection 215A is formed without formation of a contact hole. Accordingly, in determining the emitter size, it is unnecessary to consider a misalignment between the emitter contact layer 207 and a contact hole and a misalignment between a contact hole and the emitter extended interconnection 215A. Accordingly, the emitter size is further reduced as compared to conventional techniques. This allows higher performance of HBTs, i.e., enhancement of high-frequency characteristics.

In addition, in the third embodiment, the base extended interconnection 215B is formed without formation of a contact hole. Accordingly, the distance between a base-electrode portion (i.e., a portion in contact with the emitter layer 205) of the base extended interconnection 215B and the emitter (i.e., an effective emitter region, which is a portion of the emitter layer 205 located under the emitter cap layer 206) is reduced. Accordingly, the base resistance is reduced, resulting in further enhancement of high-frequency characteristics.

Embodiment 4

Hereinafter, an HBT and a method for fabricating the HBT according to a fourth embodiment of the present invention will be described with reference to the drawings. The HBT of this embodiment is different from that of the third embodiment in the following aspects. First, a portion of the interconnection 215B serving as a base electrode is formed over the base layer 204 with the emitter layer 205 sandwiched therebetween in the third embodiment, whereas a portion of the interconnection 215B serving as a base electrode is formed directly on the base layer 204 in this embodiment as described later. Second, the base layer 204 and the collector layer 203 are made of an identical material in the third embodiment, whereas the base layer 204 and the collector layer 203 are made of different materials so as to provide an etching selectivity between the base layer 204 and the collector layer 203 in this embodiment as described later.

Figure 16:
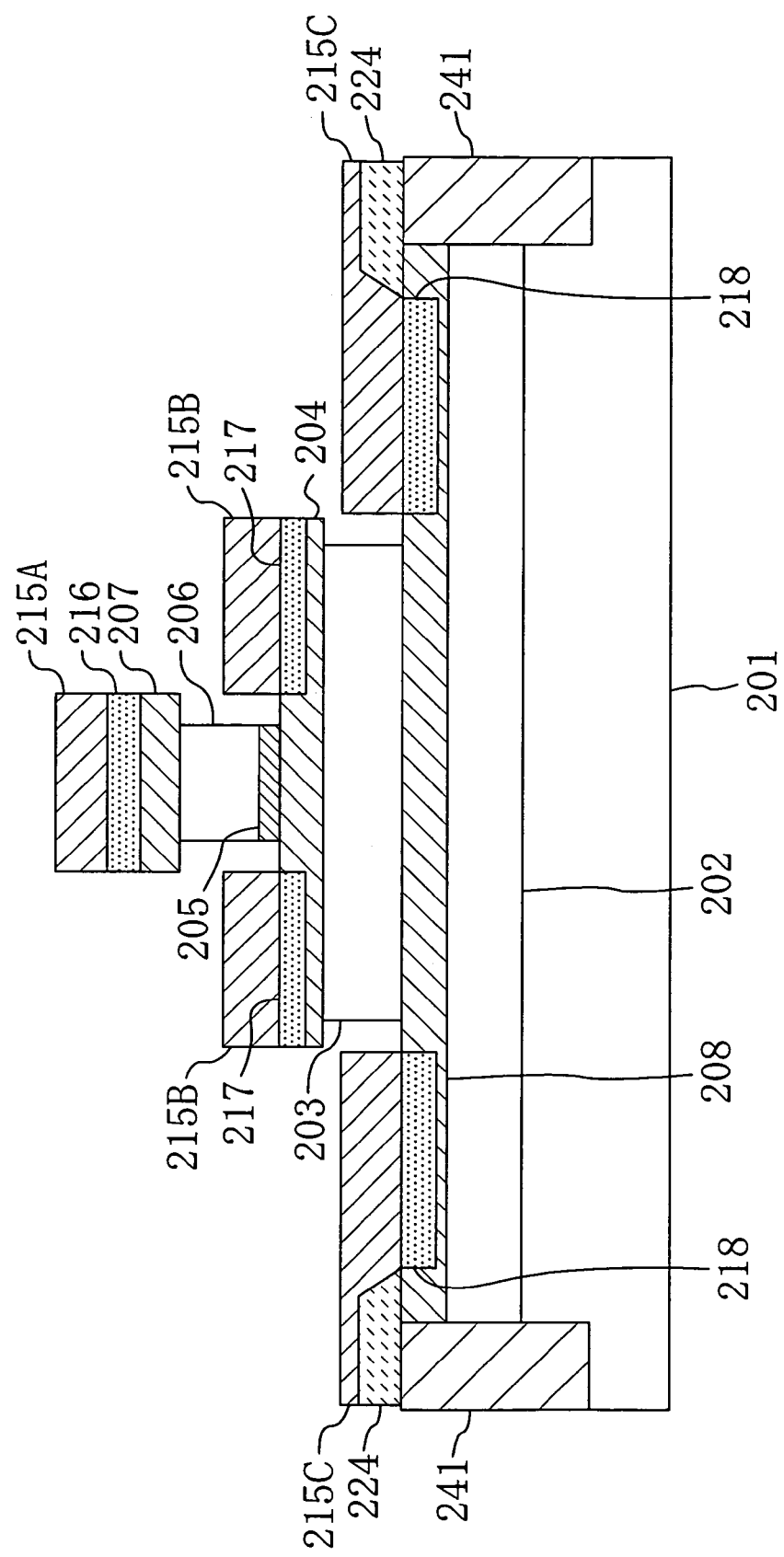
FIG. 16 is a cross-sectional view illustrating a structure of an HBT according to a fourth embodiment of the present invention.

FIG. 16 is a cross-sectional view illustrating a structure of the HBT of this embodiment.

As illustrated in FIG. 16, a first sub-collector layer 202 made of an n-type GaAs layer doped with an n-type impurity at a high concentration of, for example, about $5 \times 10^{18}$ cm$^{-3}$ is formed on a semi-insulating substrate 201 made of, for example, GaAs. A second sub-collector layer 208 made of an n-type InGaAs layer doped with an n-type impurity at a high concentration of, for example, about $1 \times 10^{19}$ cm$^{-3}$ is formed on the first sub-collector layer 202. The bandgap of InGaAs forming the second sub-collector layer 208 is smaller than that of GaAs forming the first sub-collector layer 202.

On a given region of the second sub-collector layer 208, a collector layer 203 made of an n-type GaAs layer doped with an n-type impurity at a low concentration of, for example, about $1 \times 10^{16}$ cm$^{-3}$ and a base layer 204 made of a p-type GaAs layer doped with a p-type impurity at a high concentration of, for example, about $4 \times 10^{19}$ cm$^{-3}$ are stacked in this order. That is, the stack of the collector layer 203 and the base layer 204 is formed into an island shape on the second sub-collector layer 208. The area of the base layer 204 is larger than that of the collector layer 203. Accordingly, the edge of the base layer 204 projects from the collector layer 203 to form an eave. As the collector layer 203, an i-type GaAs layer may be used.

On a given region of the base layer 204, an emitter layer 205 made of an n-type InGaP (specifically, In$_{0.48}$Ga$_{0.52}$P having an In content of about 48%) doped with an n-type impurity at a concentration of, for example, about $3 \times 10^{17}$ cm$^{-3}$, an emitter cap layer 206 made of an n-type GaAs layer doped with an n-type impurity at a high concentration of, for example, about $3 \times 10^{18}$ cm$^{-3}$ and an emitter contact layer 207 made of an n-type InGaAs layer doped with an n-type impurity at a high concentration of, for example, about $1 \times 10^{19}$ cm$^{-3}$ are stacked in this order. That is, the stack of the emitter layer 205, the emitter cap layer 206 and the emitter contact layer 207 is formed into an island shape on the base layer 204. The bandgap of In$_{0.48}$Ga$_{0.52}$P forming the emitter layer 205 is larger than that of InGaAs forming the base layer 204. The bandgap of InGaAs forming the emitter contact layer 207 is smaller than that of GaAs forming the emitter cap layer 206.

This embodiment is characterized in that an interconnection (emitter extended interconnection) 215A extended from the emitter contact layer 207, an interconnection (base extended interconnection) 215B extended from the base layer 204 and an interconnection (collector extended interconnection) 215C extended from the second sub-collector layer 208 are formed in a self-aligned manner. The emitter extended interconnection 215A, the base extended interconnection 215B and the collector extended interconnection 215C are directly extended from the emitter contact layer 207, the base layer 204 and the second sub-collector layer 208. In other words, the emitter extended interconnection 215A, the base extended interconnection 215B and the collector extended interconnection 215C also serve as an emitter electrode, a base electrode and a collector electrode, respectively.

Figure 17A:
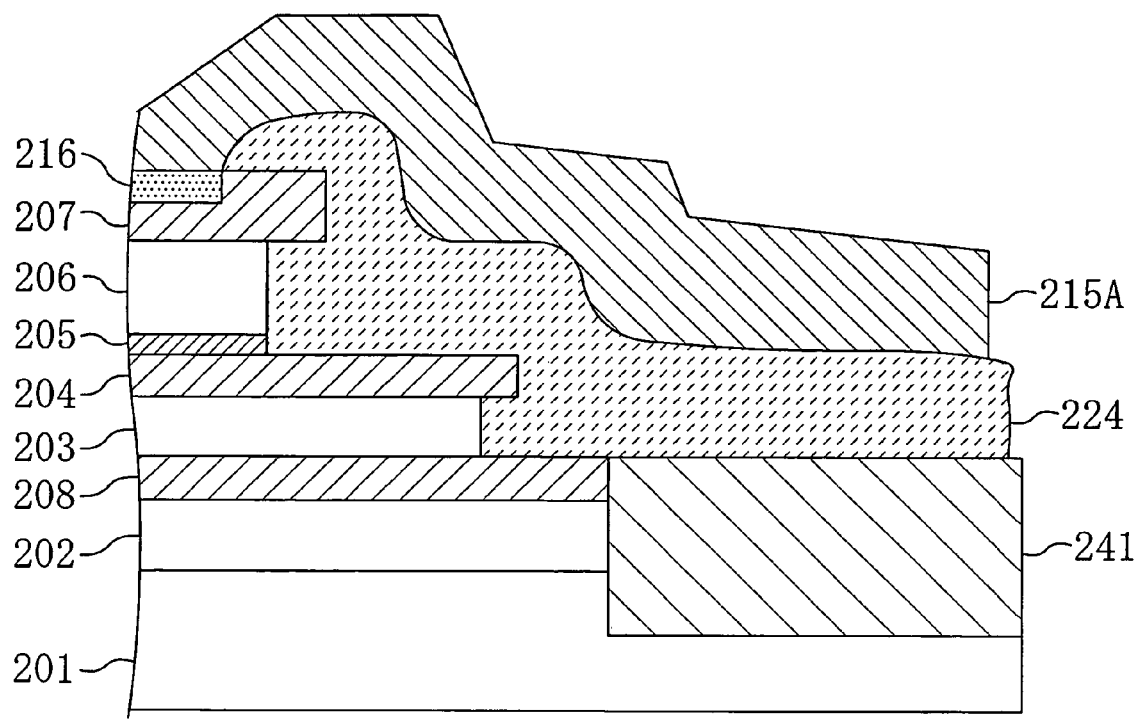
FIG. 17A is a cross-sectional view illustrating a main portion of the HBT of the fourth embodiment in the extension direction of an emitter extended interconnection.
Figure 17B:
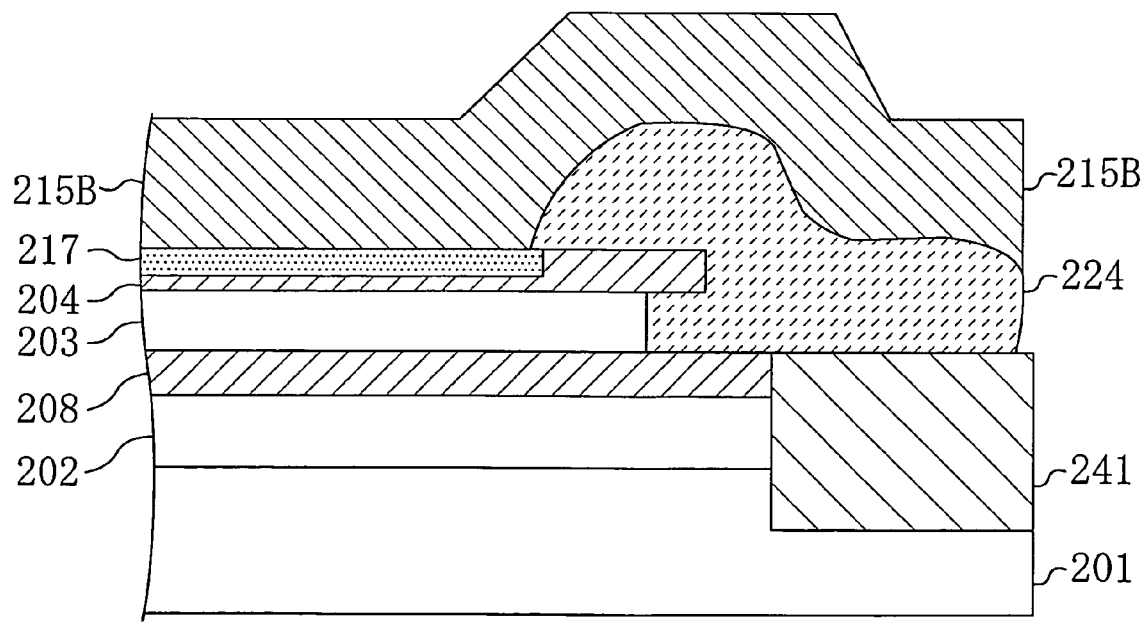
FIG. 17B is a cross-sectional view illustrating a main portion of the HBT of the fourth embodiment in the extension direction of a base extended interconnection.

FIG. 17A is a cross-sectional view illustrating a main portion of the HBT of this embodiment in the extension region of the emitter extended interconnection 215A. FIG. 17B is a cross-sectional view illustrating a main portion of the HBT of this embodiment in the extension direction of the base extended interconnection 215B.

As illustrated in FIGS. 17A and 17B, the eave-shaped edge of the emitter contact layer 207 in the extension direction of the emitter extended interconnection 215A and the eave-shaped edge of the base layer 204 in the extension direction of the base extended interconnection 215B are covered with an insulating film 224 made of, for example, a TEOS film. In this manner, it is possible to extend the emitter extended interconnection 215A and the base extended interconnection 215B from the emitter contact layer 207 and the base layer 204, respectively, while preventing step disconnection.

In a portion of the emitter contact layer 207 connected to the interconnection 215A (a portion serving as an emitter electrode), a first Pt alloyed reaction layer 216 is formed. The first Pt alloyed reaction layer 216 is formed by a reaction between Pt forming the bottom layer of the interconnection 215A and InGaAs forming the emitter contact layer 207 under heat treatment. The first Pt alloyed reaction layer 216 is formed only inside the emitter contact layer 207.

In a portion of the base layer 204 connected to the interconnection 215B (i.e., a portion serving as base electrode), a second Pt alloyed reaction layer 217 is formed. The second Pt alloyed reaction layer 217 is formed by a reaction between Pt forming the bottom layer of the interconnection 215B and InGaAs forming the base layer 204 under heat treatment. The second Pt alloyed reaction layer 217 is formed only inside the base layer 204.

In a portion of the second sub-collector layer 208 connected to the interconnection 215C (i.e., a portion serving as a collector electrode), a third Pt alloyed reaction layer 218 is formed. The third Pt alloyed reaction layer 218 is formed by a reaction between Pt forming the bottom layer of the interconnection 215C and InGaAs forming the second sub-collector layer 208 under heat treatment. The third Pt alloyed reaction layer 218 is formed only inside the second sub-collector layer 208.

In this embodiment, to electrically isolate HBTs (unit HBTs) from each other, an isolation region 241 is formed in the periphery of each HBT region to reach the substrate 201 through the stack of the second sub-collector layer 208 and the first sub-collector layer 202.

Hereinafter, a method for fabricating an HBT illustrated in FIG. 16 and FIGS. 17A and 17B according to this embodiment will be described with reference to the drawings.

Figure 18A:
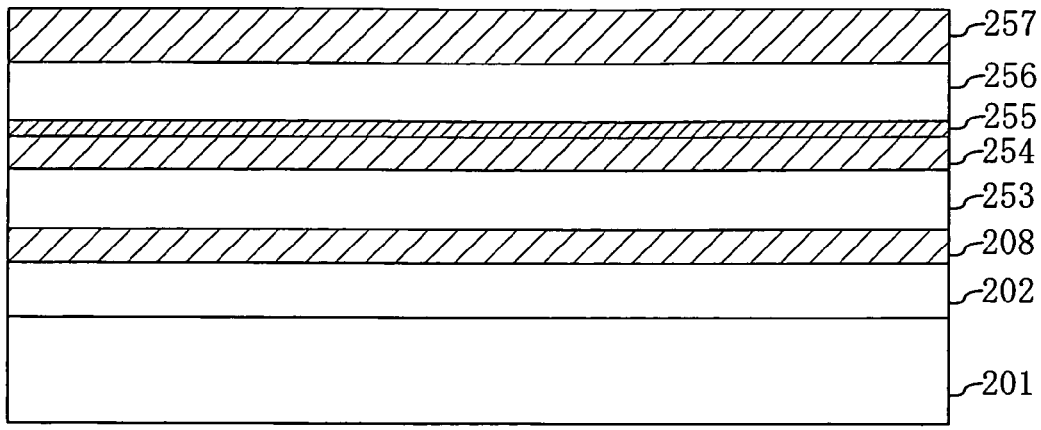
FIGS. 18A through 18C are cross-sectional views showing respective process steps of a method for fabricating an HBT according to the fourth embodiment.
Figure 18B:
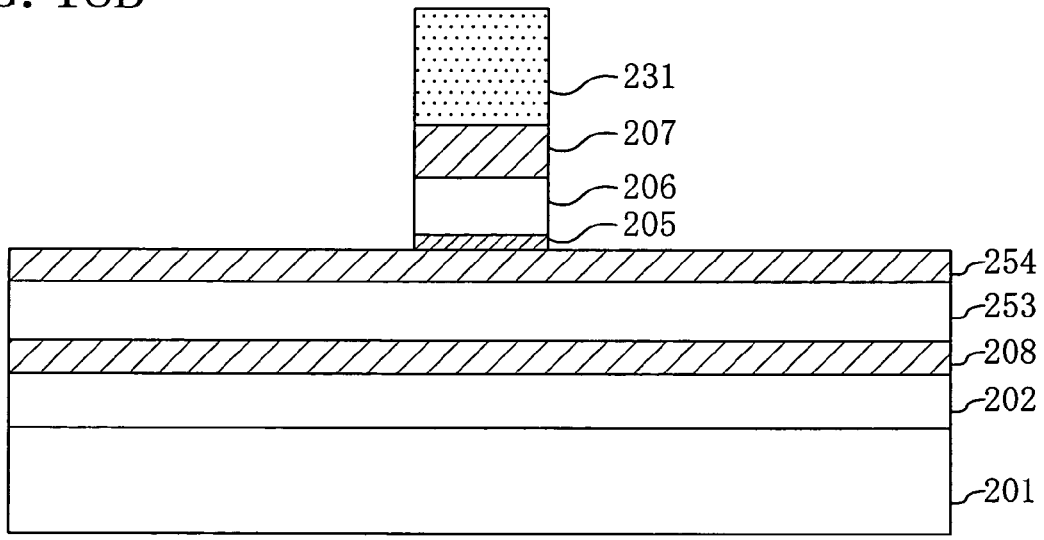
Figure 18C:
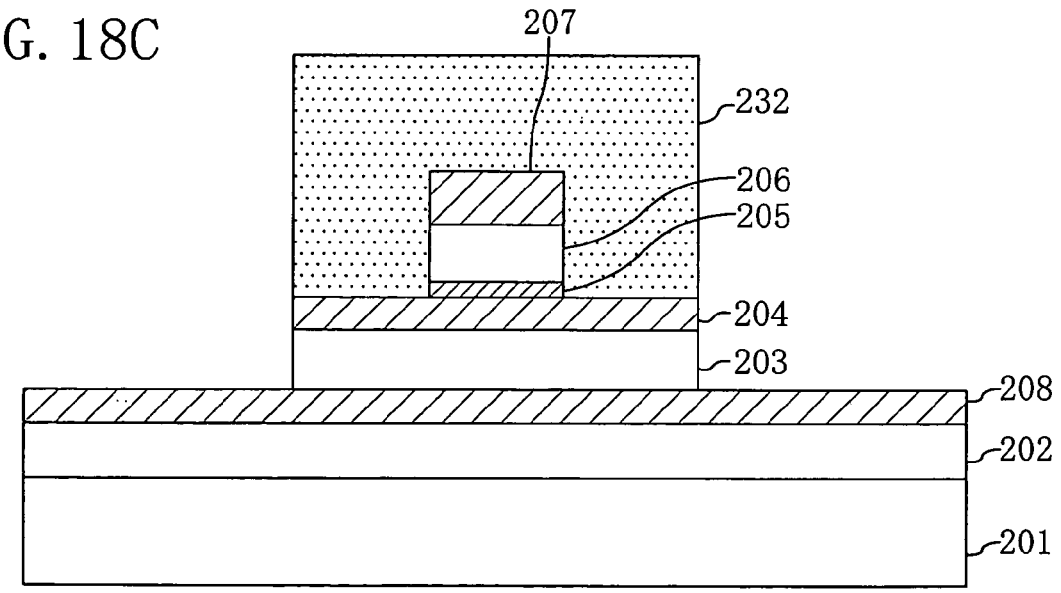
Figure 19A:
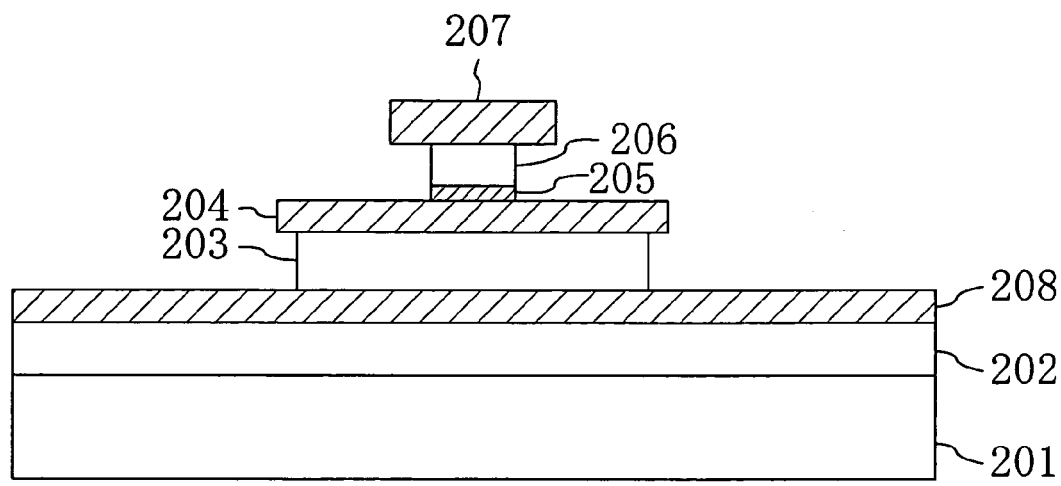
FIGS. 19A and 19B are cross-sectional views showing respective process steps of the method for fabricating the HBT of the fourth embodiment.
Figure 20A:
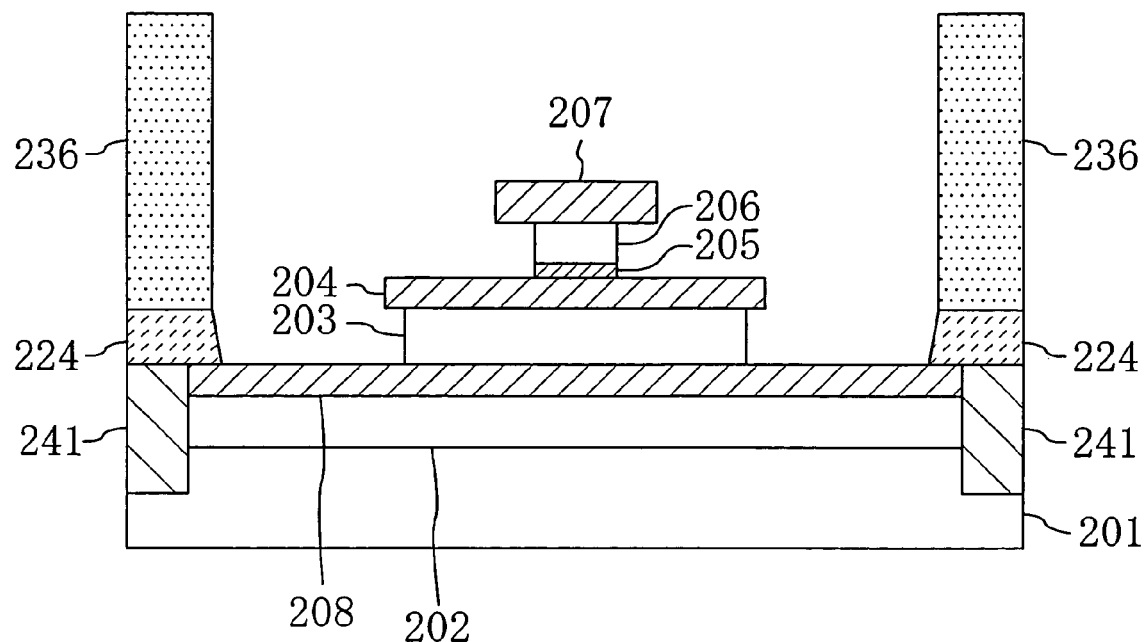
FIG. 20A is a cross-sectional view showing a process step of the method for fabricating the HBT of fourth embodiment.
Figure 20B:
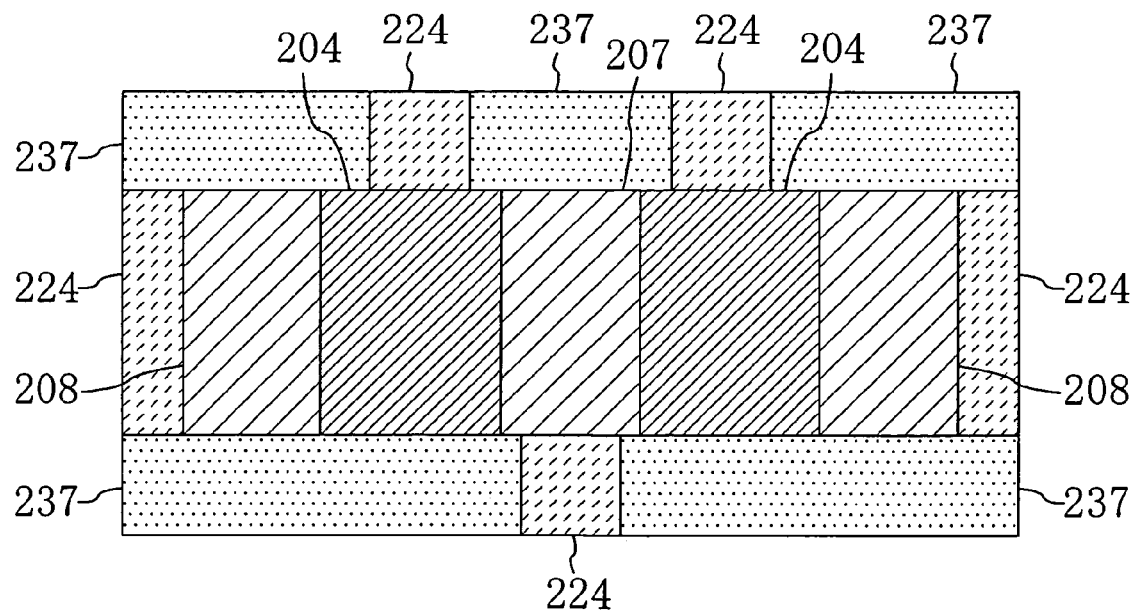
FIG. 20B is a plan view showing a process step of the method for fabricating the HBT of fourth embodiment.
Figure 21:
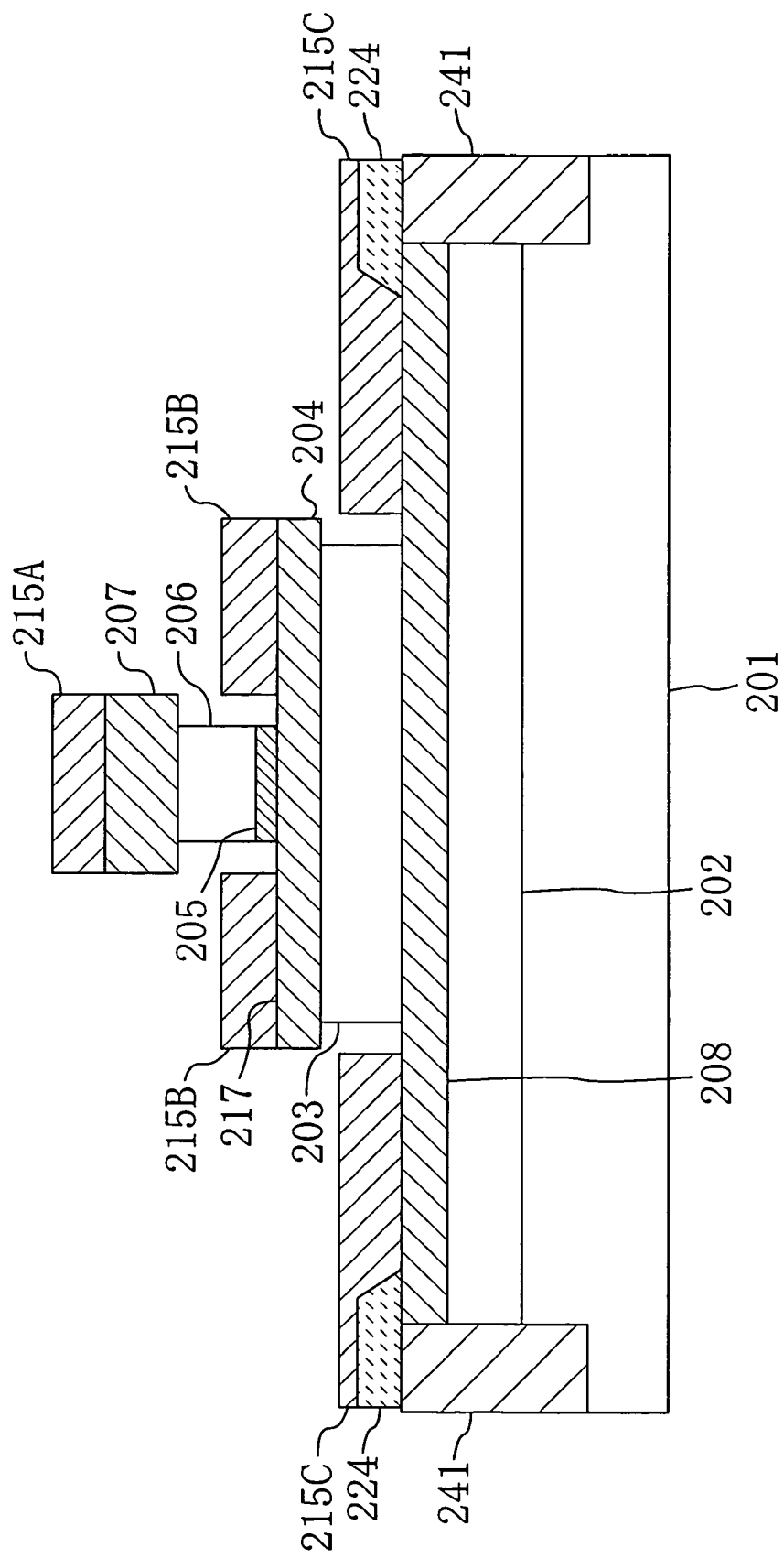
FIG. 21 is a cross-sectional view showing a process step of the method for fabricating the HBT of the fourth embodiment.
Figure 22A:
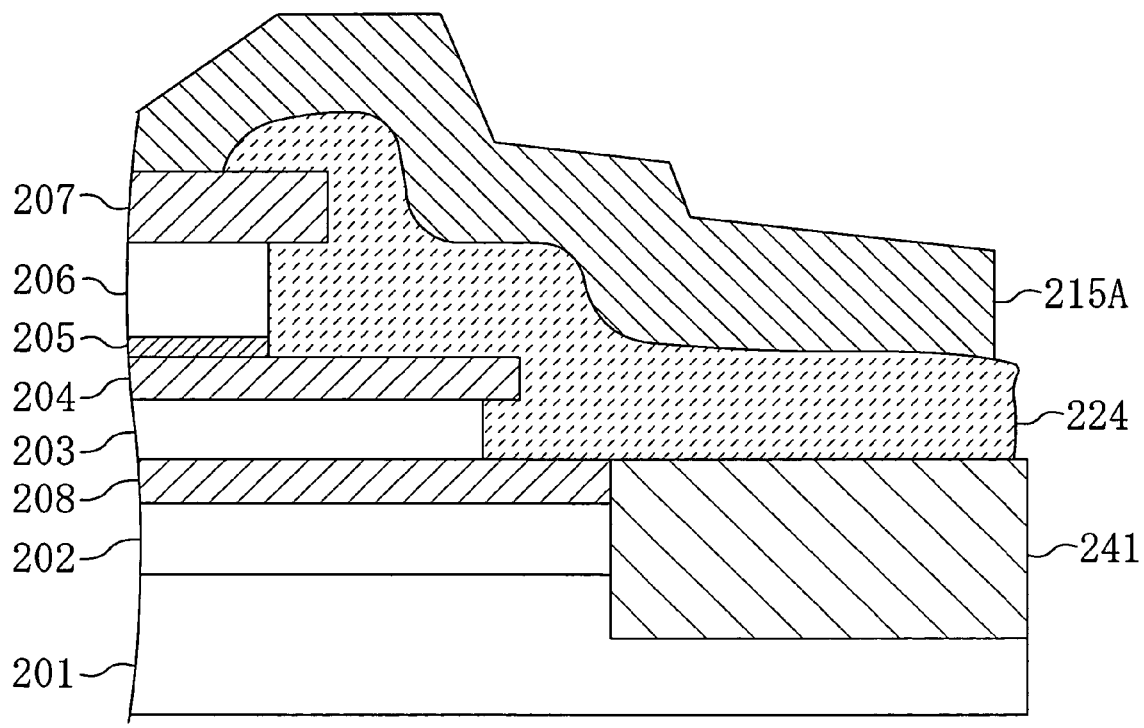
FIGS. 22A and 22B are cross-sectional views showing respective process steps of the method for fabricating the HBT of the fourth embodiment.
Figure 22B:
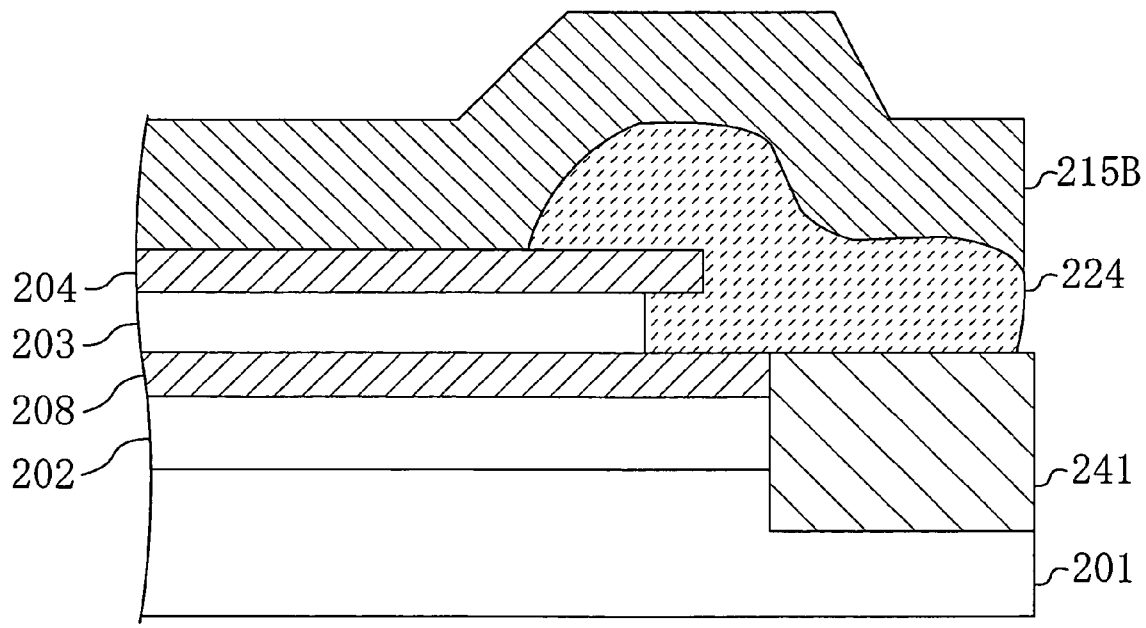
Figure 23:
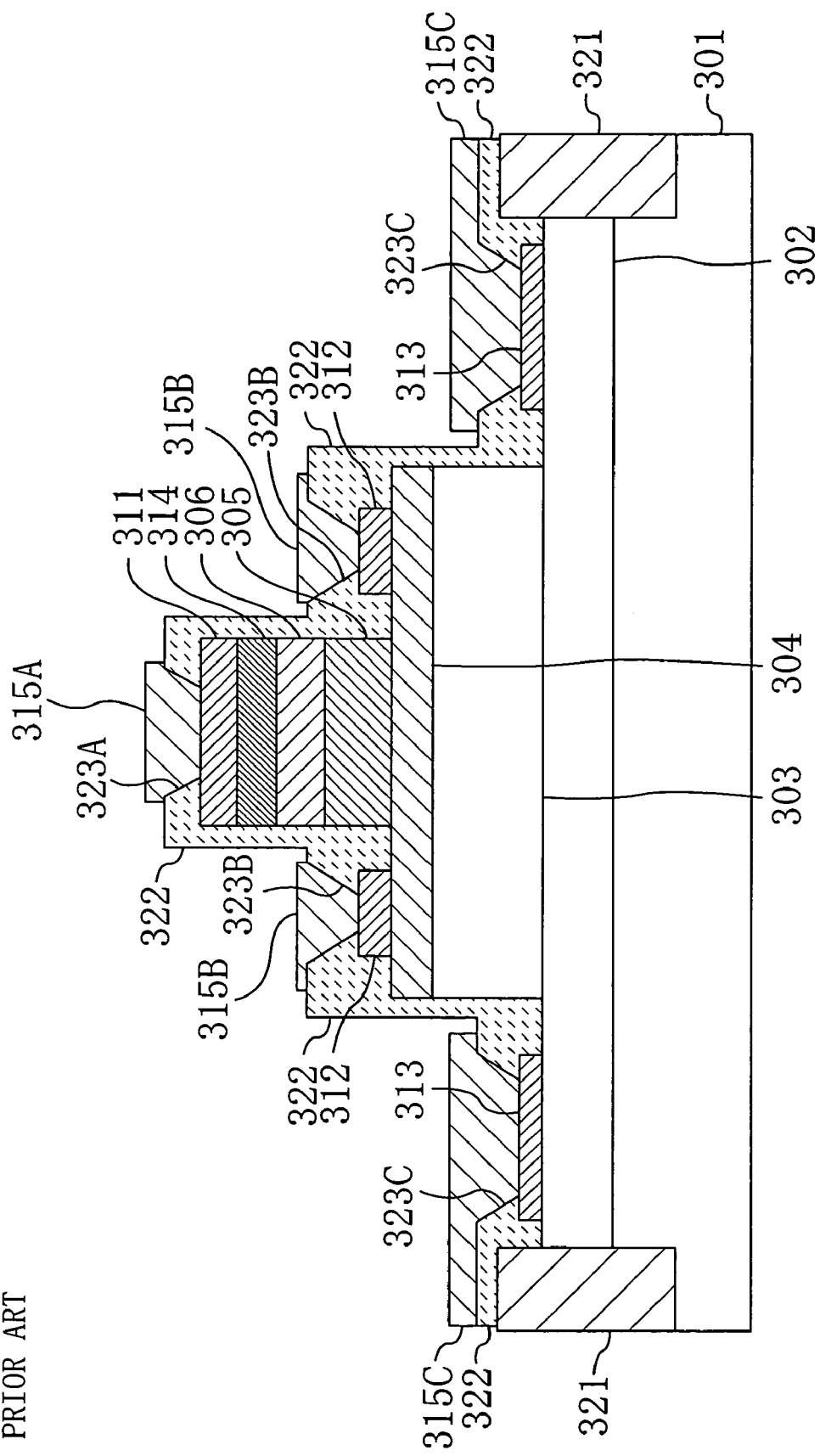
FIG. 23 is a cross-sectional view schematically illustrating a structure of a conventional HBT.

FIGS. 18A through 18C, FIGS. 19A and 19B, FIG. 20A, FIG. 21 and FIGS. 22A and 22B are cross-sectional views showing respective process steps of the method for fabricating an HBT of this embodiment. FIG. 20B is a plan view showing a process step of the method for fabricating an HBT of this embodiment. FIG. 22A is a cross-sectional view showing a process step with respect to a main portion of the HBT of this embodiment in the extension direction of an emitter extended interconnection. FIG. 22B is a cross-sectional view showing a process step with respect to a main portion of the HBT of this embodiment in the extension direction of a base extended interconnection.

First, as shown in FIG. 18A, a first sub-collector layer 202 made of an n-type GaAs layer doped with an n-type impurity at a high concentration of, for example, about $5\times10^{18}$ cm$^{-3}$, a second sub-collector layer 208 made of an n-type InGaAs layer doped with an n-type impurity at a high concentration of, for example, about $1\times10^{19}$ cm$^{-3}$, a collector-layer film 253 made of an n-type GaAs layer doped with an n-type impurity at a low concentration of, for example, about $1\times10^{16}$ cm$^{-3}$, a base-layer film 254 made of a p-type InGaAs layer doped with a p-type impurity at a high concentration of, for example, about $4\times10^{19}$ cm$^{-3}$, an emitter-layer film 255 made of an n-type InGaP (specifically, $In_{0.48}Ga_{0.52}P$ having an In content of about 48%) layer doped with an n-type impurity at a concentration of, for example, about $3\times10^{17}$ cm$^{-3}$, an emitter-cap-layer film 256 made of an n-type GaAs layer doped with an n-type impurity at a high concentration of, for example, about $3\times10^{18}$ cm$^{-3}$, and an emitter-contact-layer film 257 made of an n-type InGaAs layer doped with an n-type impurity at a high concentration of, for example, about $1\times10^{19}$ cm$^{-3}$ are formed in this order by crystal growth processes such as MBE or MOCVD over a semi-insulating substrate 201 made of, for example, GaAs. As the collector-layer film 253, an i-type GaAs layer may be formed. The bandgap of $In_{0.48}Ga_{0.52}P$ forming the emitter-layer film 255 is larger than that of GaAs forming the base-layer film 254. The bandgap of InGaAs forming the emitter-contact-layer film 257 is smaller than that of GaAs forming the emitter-cap-layer film 256.

Next, as shown in FIG. 18B, the emitter-contact-layer film 257, the emitter-cap-layer film 256 and the emitter-layer film 255 are sequentially patterned by dry etching or wet etching using a photoresist pattern 231 protecting an emitter region as a mask. In this manner, an emitter island region made of the stack of a emitter layer 205, an emitter cap layer 206 and an emitter contact layer 207 is formed and a base-electrode region of the base-layer film 254 is exposed. At this time, the base-layer film 254 is hardly etched.

Then, the photoresist pattern 231 is removed. Thereafter, as shown in FIG. 18C, the base-layer film 254 and the collector-layer film 253 are sequentially patterned by dry etching or wet etching using a photoresist pattern 232 protecting a base region including an emitter region used as a mask. In this manner, a base island region made of the stack of a collector layer 203 and a base layer 204 is formed and a collector-electrode region of the second sub-collector layer 208 is exposed. At this time, the second sub-collector layer 208 made of InGaAs is hardly etched. That is, the second sub-collector layer 208, which is an InGaAs layer, serves as an etching stopper, so that the etching accuracy in forming the base island region is greatly enhanced, as compared to conventional techniques.

Thereafter, the photoresist pattern 232 is removed. Thereafter, as shown in FIG. 19A, side etching is selectively performed on the emitter cap layer 206 and the collector layer 203 with, for example, a citric acid-based etching solution. Subsequently, side etching is selectively performed on the emitter layer 205 with, for example, a hydrochloric acid-based etching solution. In this manner, the edge of the emitter contact layer 207 projects from the emitter cap layer 206 to form an eave and the edge of the base layer 204 projects from the collector layer 203 to form an eave. During etching with a citric acid-based etching solution, the emitter contact layer 207, the second sub-collector layer 208 and the base layer 204 each made of an InGaAs layer and the emitter layer 205 made of an InGaP layer are hardly etched. During etching with a hydrochloric acid-based etching solution, the emitter contact layer 207, the second sub-collector layer 208 and the base layer 204 each made of an InGaAs layer and the emitter cap layer 206 and the collector layer 203 each made of a GaAs layer are hardly etched.

Figure 19B:
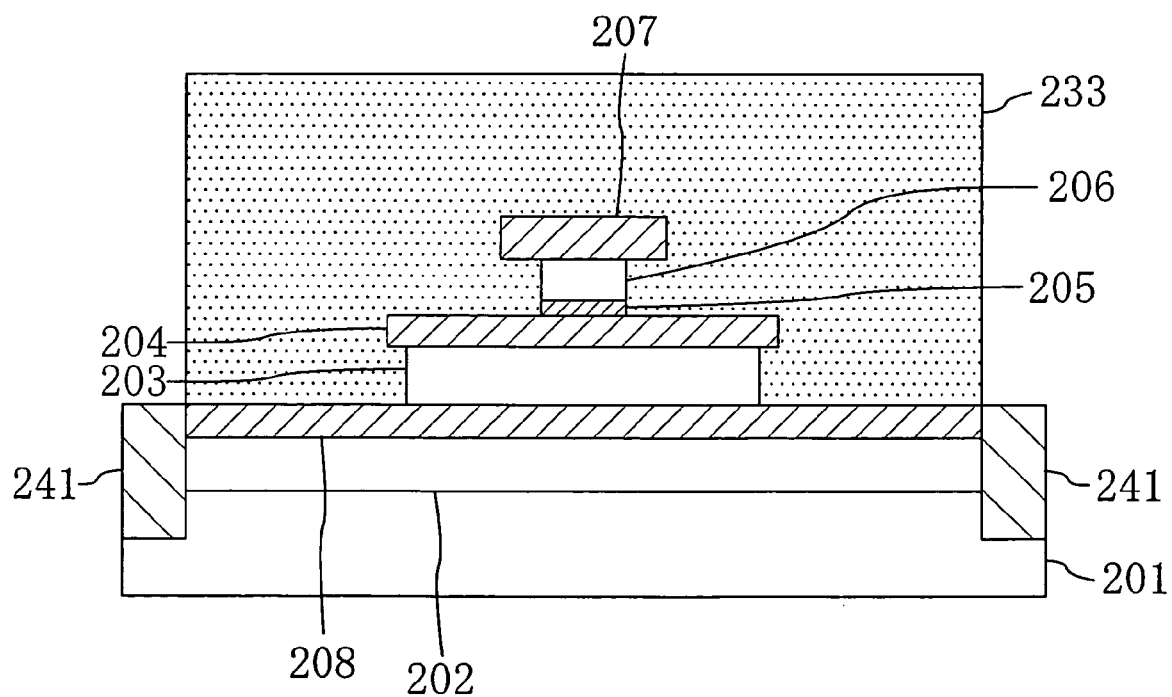

Then, as shown in FIG. 19B, helium (He) ions are implanted in the second sub-collector layer 208 and the first sub-collector layer 202 using a photoresist pattern 233 protecting unit HBT cells (i.e., HBT regions) as a mask, thereby forming an isolation region 241. In this manner, the unit HBT cells are isolated from each other.

Subsequently, the photoresist pattern 233 is removed. Then, an insulating film 224 made of, for example, a TEOS film is formed by, for example, CVD to cover the entire surface of the semi-insulating substrate 201, thereby covering the eave-shaped edge of the emitter contact layer 207 and the eave-shaped edge of the base layer 204 with the insulating film 224. Thereafter, as shown in FIG. 20A, a photoresist pattern 236 covering a given region (which is at least the eave-shaped edge of the emitter contact layer 207 in the extension direction of the emitter extended interconnection 215A (see, FIG. 22A) and the eave-shaped edge of the base layer 204 in the extension direction of the base extended interconnection 215B (see FIG. 22B)) is formed. Subsequently, dry etching or wet etching is performed on the insulating film 224 using the photoresist pattern 236 as a mask. In this manner, a portion of the insulating film 224 covering the eave-shaped edge of the emitter contact layer 207 except for the extension direction of the emitter extended interconnection 215A is removed. In addition, a portion of the insulating film 224 covering the eave-shaped edge of the base layer 204 except for the extension direction of the base extended interconnection 215B is also removed.

Then, as shown in FIG. 20B, a photoresist pattern 237 having openings on the emitter contact layer 207, the base layer 204 (i.e., a region outside the emitter contact layer 207), the second sub-collector layer 208 (i.e., a region outside the base layer 104), and portions of the insulating film 224 in the extension direction of the emitter extended interconnection 215A, the extension direction of the base extended interconnection 215B and the extension direction of the collector extended interconnection 215C (see FIG. 16) is formed. Thereafter, an interconnection conductive film 215 is formed by, for example, vapor deposition to cover the entire surface of the semi-insulating substrate 201. At this time, the interconnection conductive film 215 has a structure in which a Pt layer, a Ti layer, a Pt layer, an Au layer and a Ti layer are stacked in this order, for example. Subsequently, the photoresist pattern 237 and its overlying interconnection conductive film 215 are removed by lift-off. In this manner, as shown in FIG. 21 and FIGS. 22A and 22B, an emitter extended interconnection 215A extended from the emitter contact layer 207, a base extended interconnection 215B extended from the base layer 204 and a collector extended interconnection 215C extended from the second sub-collector layer 208 are formed. That is, in this embodiment, the interconnections 215A, 215B and 215C also serve as an emitter electrode, a base electrode and a collector electrode, respectively.

This embodiment is characterized in that the edge of the emitter contact layer 207 projects from the emitter cap layer 206 to form an eave and the edge of the base layer 204 projects from the collector layer 203 to form an eave, so that an emitter extended interconnection 215A also serving as an emitter electrode, a base extended interconnection 215B also serving as a base electrode and a collector extended interconnection 215C also serving as a collector electrode are formed in a self-aligned manner on the emitter contact layer 207, the base layer 204 and the second sub-collector layer 208, respectively. That is, the eave-shaped edge of the emitter contact layer 207 prevents a connection between the emitter extended interconnection 215A and the base extended interconnection 215B and the eave-shaped edge of the base layer 204 prevents a connection between the base extended interconnection 215B and the collector extended interconnection 215C. Accordingly, unlike conventional techniques, it is unnecessary to form contact holes in an insulating film covering a semiconductor layer so that extended interconnections are formed to be aligned with the contact holes.

As illustrated in FIGS. 22A and 22B, the eave-shaped edge of the emitter contact layer 207 in the extension direction of the emitter extended interconnection 215A and the eave-shaped edge of the base layer 204 in the extension direction of the base extended interconnection 215B are covered with the insulating film 224. Accordingly, it is possible to extend the emitter extended interconnection 215A and the base extended interconnection 215B from the emitter contact layer 207 and the base layer 204, respectively, while preventing step disconnection.

Thereafter, heat treatment for inactivating the isolation region (i.e., an isolation region formed by ion implantation) 241 for electrically isolating the unit HBT cells from each other is performed. In this embodiment, with this heat treatment, a metal (specifically, Pt) forming the bottom layer of the interconnection 215A and a material forming a portion of the emitter contact layer 207 in contact with the interconnection 215A react with each other. In the same manner, a metal (specifically, Pt) forming the bottom layer of the interconnection 215B and a material forming a portion of the base layer 204 in contact with the interconnection 215B react with each other. In addition, a metal (specifically, Pt) forming the bottom layer of the interconnection 215C and a material forming a portion of the second sub-collector layer 208 in contact with the interconnection 215C react with each other. In this manner, as shown in FIG. 16, a first Pt alloyed reaction layer 216 is formed in a portion of the emitter contact layer 207 located under the interconnection 215A, a second Pt alloyed reaction layer 217 is formed in a portion of the base layer 204 located under the interconnection 215B, and a third Pt alloyed reaction layer 218 is formed in a portion of the second sub-collector layer 208 located under the interconnection 215C. In this manner, an HBT of this embodiment illustrated in FIG. 16 is completed. The first Pt alloyed reaction layer 216 is formed only inside the emitter contact layer 207. The second Pt alloyed reaction layer 217 is formed only inside the base layer 204. The third Pt alloyed reaction layer 218 is formed only inside the second sub-collector layer 208.

In the fourth embodiment, a high-concentration n-type semiconductor of a material having a small bandgap is used for each of the emitter contact layer 207 and the second sub-collector layer 208. Accordingly, an Ohmic contact is easily formed between a metal used for the emitter extended interconnection 215A extended from the emitter contact layer 207 and the emitter contact layer 207. In addition, an Ohmic contact is also easily formed between a metal used for the collector extended interconnection 215C extended from the second sub-collector layer 208 and the second sub-collector layer 208. That is, not only the base extended interconnection 215B also serving as a base electrode but also the emitter extended interconnection 215A also serving as an emitter electrode and the collector extended interconnection 215C also serving as a collector electrode are formed. As a result, process steps for forming an emitter electrode, a base electrode and a collector electrode, which are performed separately from process steps for forming interconnections in conventional techniques, are omitted, thus reducing fabrication cost.

In conventional techniques, it is necessary to consider three misalignments: a misalignment between an emitter contact layer and an emitter electrode; a misalignment between an emitter electrode and a contact hole; and a misalignment between a contact hole and an interconnection.

On the other hand, in the fourth embodiment, the interconnections such as the emitter extended interconnection 215A are formed in a self-aligned manner, i.e., the emitter extended interconnection 215A is formed without formation of a contact hole. Accordingly, in determining the emitter size, it is unnecessary to consider a misalignment between the emitter contact layer 207 and a contact hole and a misalignment between a contact hole and the emitter extended interconnection 215A. Accordingly, the emitter size is further reduced as compared to conventional techniques. This allows higher performance of HBTs, i.e., enhancement of high-frequency characteristics.

In addition, in the fourth embodiment, the base extended interconnection 215B is formed without formation of a contact hole. Accordingly, the distance between a base-electrode portion (i.e., a portion in contact with the base layer 204) of the base extended interconnection 215B and the emitter layer 205 (i.e., an effective emitter region) is reduced. Accordingly, the base resistance is reduced, resulting in further enhancement of high-frequency characteristics.

In the first through fourth embodiments, the impurity concentration, thickness and composition, for example, of each semiconductor layer forming an HBT are not limited to the values described above.

In the first through fourth embodiments, a Pt layer is used as the bottom layer of each of the extended interconnections also serving as an emitter electrode, a base electrode and a collector electrode, respectively. Alternatively, a Pd layer or a Ni layer, for example, may be used. In such a case, an alloyed reaction layer is formed under an electrode portion of each of the extended interconnections, so that the same advantages as in those the first through fourth embodiments are obtained.

In the first through fourth embodiments, the isolation region is formed using ion implantation. Alternatively, a trench to be an isolation region may be formed using, for example, wet etching.

In the first through fourth embodiments, an InGaP layer is used as an emitter layer. Alternatively, an AlGaAs layer may be used.

In the first through fourth embodiments, InGaAs layers are used as the second substrate-collector layer and the emitter contact layer. Alternatively, a semiconductor stacked structure including an InGaAs layer may be used.

In the first through fourth embodiments, an HBT using a GaAs substrate as a semi-insulating substrate is employed. Alternatively, an HBT using an InP substrate as a semi-insulating substrate and using an InP layer or an InAlAs layer, for example, as an emitter layer may be employed. In such a case, the same advantages are, of course, obtained.

In the first or second embodiment, a $SiO_2$ film is used as the insulating film 122 in which contact holes for extended interconnections are provided. Alternatively, other types of insulating films, e.g., a SiN film, may be used.

The third or fourth embodiment, a TEOS film is used as the insulating film 224 covering the eave-shaped edge of the emitter contact layer 207 and the eave-shaped edge of the base layer 204 or the emitter layer 205. Alternatively, other types of insulating films may be used.

What is claimed is:

1. A heterojunction bipolar transistor, comprising:
   a high-concentration n-type first sub-collector layer;
   a high-concentration n-type second sub-collector layer formed on the first sub-collector layer and made of a material having a bandgap smaller than that of the first sub-collector layer;
   an i-type or low-concentration n-type collector layer formed on a given portion of the second sub-collector layer;
   a high-concentration p-type base layer formed on the collector layer;
   an n-type emitter layer formed on the base layer and made of a material having a bandgap larger than that of the base layer;
   a high-concentration n-type emitter cap layer formed on a given portion of the emitter layer;
   a high-concentration n-type emitter contact layer formed on the emitter cap layer and made of a material having a bandgap smaller than that of the emitter cap layer;
   a first interconnection extended from the emitter contact layer and including a portion serving as an emitter electrode;
   a second interconnection extended from a portion of the emitter layer on which the emitter cap layer is not formed and including a portion serving as a base electrode; and
   a third interconnection extended from a portion of the second sub-collector layer on which the collector layer is not formed and including a portion serving as a collector electrode.

2. The heterojunction bipolar transistor of claim 1, wherein a first alloyed reaction layer is formed in a portion of the emitter contact layer connected to the portion serving as the emitter electrode,
   a second alloyed reaction layer is formed in a portion of the emitter layer connected to the portion serving as the base electrode, and
   a third alloyed reaction layer is formed in a portion of the second sub-collector layer connected to the portion serving as the collector electrode.

3. The heterojunction bipolar transistor of claim 1, wherein the first interconnection, the second interconnection and the third interconnection are made of an identical material.

4. The heterojunction bipolar transistor of claim 1, wherein each of the second sub-collector layer and the emitter contact layer is a semiconductor layer including an InGaAs layer.

5. The heterojunction bipolar transistor of claim 1, wherein a bottom layer of each of the first interconnection, the second interconnection and the third interconnection includes at least one material selected from the group consisting of Pt, Pd and Ni.

* * * * *